US012136627B2

(12) United States Patent
Chuang et al.

(10) Patent No.: US 12,136,627 B2
(45) Date of Patent: Nov. 5, 2024

(54) 3DIC STRUCTURE FOR HIGH VOLTAGE DEVICE ON A SOI SUBSTRATE

(71) Applicant: Taiwan Semiconductor Manufacturing Company, Ltd., Hsinchu (TW)

(72) Inventors: Harry-Hak-Lay Chuang, Zhubei (TW); Wen-Tuo Huang, Tainan (TW); Hsin Fu Lin, Hsinchu County (TW); Wei Cheng Wu, Zhubei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 357 days.

(21) Appl. No.: 17/572,891

(22) Filed: Jan. 11, 2022

(65) Prior Publication Data

US 2022/0415930 A1    Dec. 29, 2022

Related U.S. Application Data

(60) Provisional application No. 63/214,406, filed on Jun. 24, 2021.

(51) Int. Cl.
*H01L 21/762* (2006.01)
*H01L 21/768* (2006.01)
(Continued)

(52) U.S. Cl.
CPC .... *H01L 27/1207* (2013.01); *H01L 21/76264* (2013.01); *H01L 21/76898* (2013.01); *H01L 23/481* (2013.01)

(58) Field of Classification Search
CPC ............... H01L 21/76283; H01L 21/76802
See application file for complete search history.

(56) References Cited

U.S. PATENT DOCUMENTS

2012/0168935 A1    7/2012    Huang
2014/0319694 A1*  10/2014   Graves-Abe ...... H01L 21/76898
                                                            438/514
(Continued)

FOREIGN PATENT DOCUMENTS

TW    201230279 A    7/2012
TW    202111891 A    3/2021

*Primary Examiner* — Samuel A Gebremariam
(74) *Attorney, Agent, or Firm* — Eschweiler & Potashnik, LLC

(57) ABSTRACT

In some embodiments, the present disclosure relates to a device that includes a silicon-on-insulator (SOI) substrate. A first semiconductor device is disposed on a frontside of the SOI substrate. An interconnect structure is arranged over the frontside of the SOI substrate and coupled to the first semiconductor device. A shallow trench isolation (STI) structure is arranged within the frontside of the SOI substrate and surrounds the first semiconductor device. First and second deep trench isolation (DTI) structures extend from the STI structure to an insulator layer of the SOI substrate. Portions of the first and second DTI structures are spaced apart from one another by an active layer of the SOI substrate. A backside through substrate via (BTSV) extends completely through the SOI substrate from a backside to the frontside of the SOI substrate. The BTSV is arranged directly between the first and second DTI structures.

20 Claims, 16 Drawing Sheets

(51) Int. Cl.
*H01L 23/48* (2006.01)
*H01L 27/12* (2006.01)

(56) References Cited

U.S. PATENT DOCUMENTS

| | | |
|---|---|---|
| 2016/0020145 A1 | 1/2016 | Lee et al. |
| 2017/0040358 A1 | 2/2017 | Kim et al. |
| 2021/0043593 A1 | 2/2021 | Huang et al. |
| 2021/0082873 A1 | 3/2021 | Chen et al. |

* cited by examiner

3DIC STRUCTURE FOR HIGH VOLTAGE DEVICE ON A SOI SUBSTRATE

REFERENCE TO RELATED APPLICATION

This application claims the benefit of U.S. Provisional Application No. 63/214,406, filed on Jun. 24, 2021, the contents of which are incorporated by reference in their entirety.

BACKGROUND

Modern day integrated chips comprise millions or billions of semiconductor devices formed on a semiconductor substrate (e.g., silicon). Integrated chips (ICs) may use many different types of semiconductor devices, depending on an application of an IC. To reduce the area of the IC, the semiconductor devices may be formed in close proximity to one another. To prevent interference amongst the semiconductor devices, techniques and/or features for device isolation in ICs are being researched. Among other things, deep trench isolation structures are a promising candidate to provide electrical isolation amongst semiconductor devices to improve device performance without sacrificing a large area on the IC.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
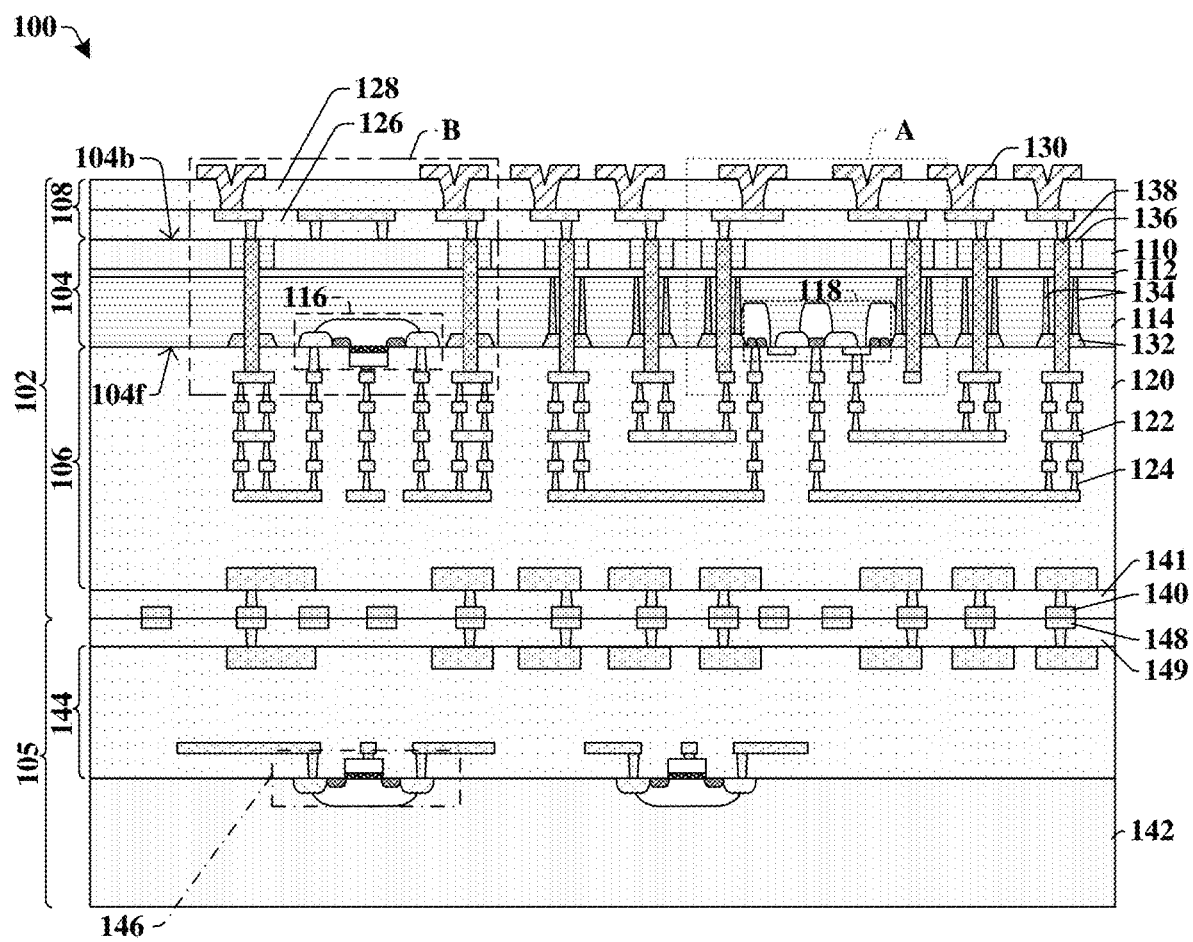
FIG. 1 illustrates a cross-sectional view of some embodiments of a first integrated chip bonded to a second integrated chip, wherein the first integrated chip comprises a high-voltage semiconductor device arranged on a frontside of a substrate, deep trench isolation structures arranged around the high-voltage semiconductor device, and backside through substrate vias that extend between the deep trench isolation structures to couple circuitry on a backside of the substrate to the high-voltage semiconductor device.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Often, more than one semiconductor device is integrated onto a same substrate. However, current leakage, cross-talk between the semiconductor devices, and/or eventual device performance degradation can be difficult to prevent as device size decreases yet voltage operating conditions increase (e.g., greater than 100 Volts). To mitigate current leakage and device performance degradation, multiple semiconductor devices may be integrated on a silicon-on-insulator (SOI) substrate in some embodiments. Additionally, in some embodiments, to arrange semiconductor devices even closer to one another and provide reliable device isolation, isolation structures, such as, for example, deep trench isolation (DTI) structures, are formed to electrically separate the semiconductor devices from one another.

Even with isolation structures, in some instances, forming high voltage devices on a substrate alongside other semiconductor devices may be difficult. For example, forming a bipolar complementary metal oxide semiconductor double diffused metal oxide semiconductor (BCD) device comprises many complex manufacturing steps such as changing a substrate, using high temperatures, forming and removing dummy structures, forming DTIs and other complex manufacturing steps compared to the manufacturing steps used to form some less complication devices. Such complex manufacturing steps used to form a high voltage device may damage other semiconductor devices on the same substrate and/or reduce efficiency of forming the high voltage device arranged beside a less complex semiconductor device.

Various embodiments of the present disclosure relate to forming a high voltage device on a first substrate with deep trench isolation structures surrounding backside through substrate vias (BTSV). The first substrate is part of a first integrated chip (IC) that is bonded to a second IC comprising a second substrate. This way, the high voltage device(s) on the first substrate may be integrated with other semiconductor devices on the second substrate without having to form the high voltage devices and the other semiconductor devices at a same time on a same substrate. Therefore, the other semiconductor devices on the second substrate may not be damaged during the complex manufacturing of the high voltage devices on the first substrate. In some embodiments, some other semiconductor devices are still formed beside the high voltage device on the first substrate, but such other semiconductor devices can withstand the complex manufacturing processing used to form the high voltage device. Further, the deep trench isolation structures effectively isolate the BTSV of the high voltage device from other semiconductor device(s) laterally beside the high voltage device on the first substrate.

FIG. 1 illustrates a cross-sectional view 100 of some embodiments of three-dimensional integrated chip (3DIC) comprising a first integrated chip (IC) bonded to a second IC, wherein the first IC comprises a high-voltage semiconductor.

The 3DIC of FIG. 1 includes a first IC 102 arranged over and bonded to a second IC 105. In some embodiments, the first IC 102 comprises a silicon-on-insulator (SOI) substrate 104. The SOI substrate 104 comprises an insulator layer 112 arranged between an active layer 114 and a base layer 110. In some embodiments, a backside 104b of the SOI substrate 104 is defined by a topmost surface of the base layer 110 of FIG. 1, and a frontside 104f of the SOI substrate 104 is defined by a bottommost surface of the active layer 114 of FIG. 1, wherein in FIG. 1, the base layer 110 is arranged over the active layer 114. Thus, it will be appreciated that the SOI substrate 104 in FIG. 1 is inverted compared to a conventional orientation of an SOI substrate 104, wherein the active layer 114 is arranged above the base layer 110. Nevertheless, in some embodiments, a first semiconductor device 118 is arranged on and within the active layer 114 of the SOI substrate 104, wherein the first semiconductor device 118 extends from the frontside 104f of the SOI substrate 104 toward the backside 104b of the SOI substrate 104. In some embodiments, the first semiconductor device 118 is a high-voltage device, meaning the first semiconductor device 118 is configured to operate at voltages greater than about 100 volts. For example, in some embodiments, the first semiconductor device 118 may be or comprise, for example, a transistor device such as a metal oxide semiconductor field effect transistor (MOSFET), a finFET, a gate all around FET (GAAFET), a bipolar complementary metal oxide semiconductor double diffused metal oxide semiconductor (BCD) device comprising multiple transistor devices, or some other suitable semiconductor device. Exemplary features of the first semiconductor device 118 will be explained in more detail in FIG. 2.

Further, in some embodiments, the first IC 102 may comprise a second semiconductor device 116 arranged on and within the active layer 114 of the SOI substrate 104, wherein the second semiconductor device 116 extends from the frontside 104f of the SOI substrate 104 toward the backside 104b of the SOI substrate 104. In some embodiments, the second semiconductor device 116 is a medium- or low-voltage device, meaning the second semiconductor device 116 is configured to operate at voltages less than about 100 volts. Therefore, the second semiconductor device 116 is configured to operate at a lower voltage than the first semiconductor device 118. In some embodiments, the second semiconductor device 116 may be or comprise, for example, a transistor device such as a metal oxide semiconductor field effect transistor (MOSFET), a finFET, a gate all around FET (GAAFET), or some other suitable semiconductor device. Exemplary features of the second semiconductor device 116 will be explained in more detail in FIG. 3.

The first IC 102 further includes a first interconnect structure 106 arranged on the frontside 104f of the SOI substrate 104 and comprises interconnect wires 122 and interconnect vias 124 embedded within an interconnect dielectric structure 120. The interconnect wires 122 and interconnect vias 124 are coupled to the first and second semiconductor devices 118, 116. In some embodiments, a first bonding interconnect layer 141 is arranged on the first interconnect structure 106 and comprises first hybrid bonding structures 140. In some embodiments, the first hybrid bonding structures 140 are also known as first hybrid bonding contacts or otherwise include first hybrid bonding contacts. In some embodiments, the first hybrid bonding structures 140 are coupled to the interconnect wires 122 and interconnect vias 124. In some embodiments, a backside interconnect structure 108 is arranged on the backside 104b of the SOI substrate 104. In some embodiments, the backside interconnect structure 108 also comprises interconnect wires 122 and interconnect vias 124 embedded within a backside interconnect dielectric structure 126. In some embodiments, the backside interconnect structure 108 further comprises bond pad structures 130 arranged within a backside dielectric layer 128.

In some embodiments, shallow trench isolation (STI) structures 132 are arranged within the frontside 104f of the SOI substrate 104 to surround and to isolate the first semiconductor device 118 and also to surround and to isolate the second semiconductor device 116. Further, in some embodiments, deep trench isolation (DTI) structures 134 extend within the active layer 114 between the STI structures 132 and the insulator layer 112 to surround the first semiconductor device 118. The DTI structures 134 laterally surround the first semiconductor device 118 to prevent cross-talk between the first semiconductor device 118 and other conductive features or devices (e.g., the second semiconductor device 116). In some embodiments, DTI structures 134 do not surround the second semiconductor device 116 because of the lower voltages that travel through the second semiconductor device 116 compared to the first semiconductor device 118; the lower the voltages traveling through a device, the less isolation is needed for that device.

In some embodiments, the first IC 102 further comprises backside through substrate vias (BTSVs) 138 that extend completely through the SOI substrate 104 and a portion of the interconnect dielectric structure 120 of the first interconnect structure 106 to electrically connect the backside interconnect structure 108 with the first interconnect structure 106. During operation, signals (e.g., voltage, current) can be sent from the bond pad structures 130 to the first and/or second semiconductor devices 118, 116 through the backside interconnect structure 108, the BTSVs 138, and the first interconnect structure 106. To prevent cross-talk between the BTSVs 138 coupled to the first semiconductor device 118 and between those BTSVs 138 and the first and/or second semiconductor device 118, 116, the BTSVs 138 coupled to the first semiconductor device 118 are each arranged between DTI structures 134. In some embodiments, isolation spacer structures 136 are arranged along outer sidewalls of the BTSVs 138 to separate the BTSVs 138 from the base layer 110 of the SOI substrate 104 to prevent the BTSVs 138 from cross-talk within the base layer 110.

In some embodiments, the second IC 105 comprises a third semiconductor device 146 within a second substrate 142. Further, in some embodiments, a second interconnect structure 144 is arranged over the second substrate 142 and comprises interconnect wires 122 and interconnect vias 124 within an interconnect dielectric structure 120. In some embodiments, second hybrid bonding structures 148 are arranged within a second bonding interconnect layer 149 over the second interconnect structure 144. In some embodiments, the second hybrid bonding structures 148 are also known as second hybrid bonding contacts or otherwise include second hybrid bonding contacts. The second IC 105 is bonded to the first IC 102 through the second hybrid bonding structures 148 and the first hybrid bonding structures 140. In some embodiments, the third semiconductor device 146 operates at a lower voltage than the first semiconductor device 118, whereby the third semiconductor device 146 may also be known as a low voltage device in some embodiments. Exemplary features of the third semiconductor device 146 will be explained in more detail in FIG. 12.

In some embodiments, the third semiconductor device 146 is formed within the second IC 105 and the first semiconductor device 118 is formed within the first IC before bonding the second IC 105 to the first IC 102. Therefore, the various manufacturing processes used to form the first semiconductor device 118, which may be complex (e.g., high temperatures, multiple layer deposition/removal steps, etc.) because the first semiconductor device 118 is a high-voltage device, do not affect the third semiconductor device 146, thereby mitigating damage and improving reliability of the third semiconductor device 146. Further, because the first IC 102 is bonded to the second IC 105 in the vertical direction to form a 3DIC, the first semiconductor device 118 can be integrated within a same device without sacrificing device density.

Figure 2:
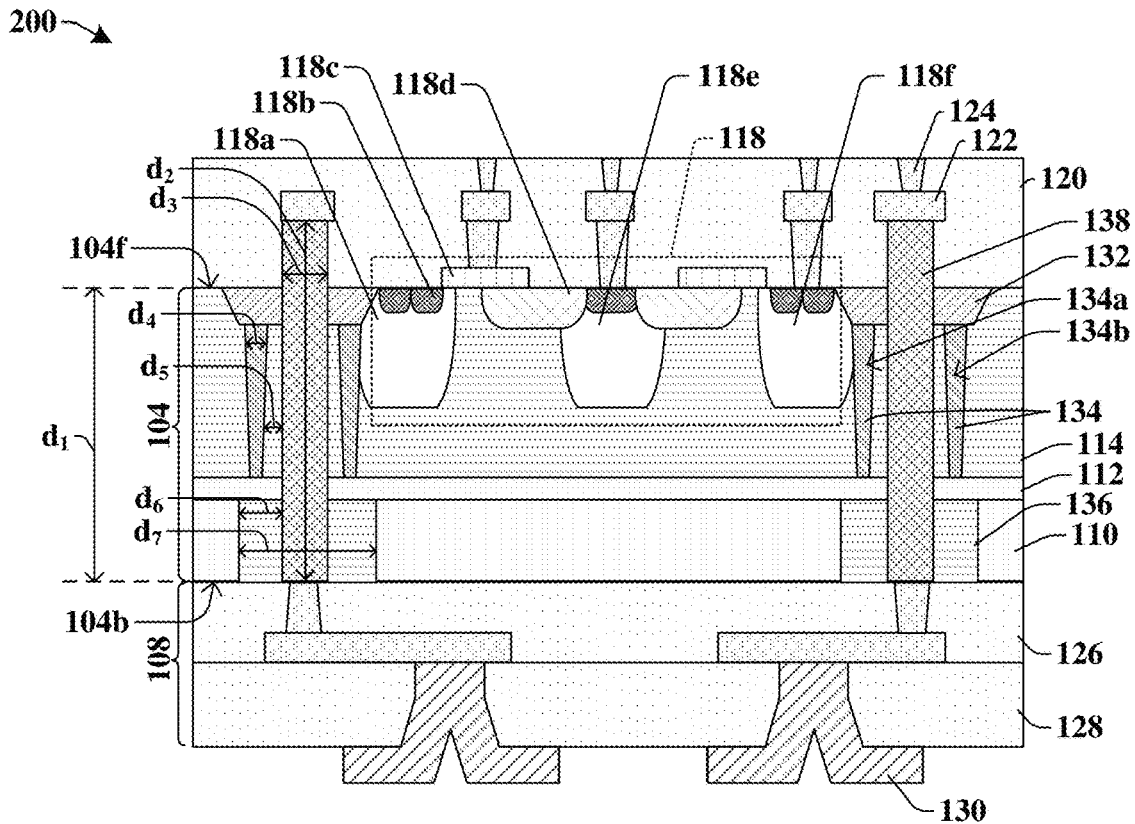
FIGS. 2 and 3 illustrate magnified, cross-sectional views corresponding to device regions of the cross-sectional view of FIG. 1.

FIG. 2 illustrates a magnified, cross-sectional view 200 that corresponds some embodiments of box A of FIG. 1. The magnified, cross-sectional view 200 includes the first semiconductor device 118 of the first IC (102 of FIG. 1).

In some embodiments, the first semiconductor device 118 comprises a bipolar complementary metal oxide semiconductor double diffused metal oxide semiconductor (BCD) device. In some such embodiments, the BCD device may comprise a lightly doped region 118a within the active layer 114 of the SOI substrate 104, densely doped regions 118b within upper areas of the active layer 114 of the SOI substrate 104, a drain region 118f spaced apart from the lightly doped region 118a, and a source region 118e arranged between the lightly doped region 118a and the drain region 118f. Further, in some embodiments, gate electrodes 118c are arranged over the frontside 104f of the SOI substrate 104 and between the lightly doped region 118a and the source region 118e and between the lightly doped region 118a and the drain region 118f. In some embodiments, the BCD device (e.g., the first semiconductor device 118) may further comprise dielectric structures 118d on or within the active layer 114 of the SOI substrate 104 between the lightly doped region 118a and the source region 118e and between the lightly doped region 118a and the drain region 118f. In some embodiments, the first semiconductor device 118 may comprise more or less features than what are illustrated in the magnified, cross-sectional view 200 of FIG. 2. Further, in some embodiments, the first semiconductor device 118 is not a BCD device, but is some other semiconductor device arranged on and/or within the SOI substrate 104.

The first semiconductor device 118 may be arranged within the SOI substrate 104 because the SOI substrate 104 is more suitable for reliable operation of high-voltage devices. In some embodiments, the first semiconductor device 118 may operate at voltages in the range of between, for example, approximately 20 volts and approximately 120 volts.

The first semiconductor device 118 is surrounded by the STI structures 132 and the DTI structures 134. In some embodiments, the DTI structures 134 are ring-shaped and thus, continuously surround the first semiconductor device 118. Similarly, in some embodiments, the STI structures 132 are ring-shaped and thus, continuously surround the first semiconductor device 118. In some such embodiments, the STI structure 132 on the left and on the right of the first semiconductor device 118 in FIG. 2 may be cross-sections from the same STI structure 132. In some embodiments, the two DTI structures 134 are arranged below each STI structure 132. For example, in some embodiments, a first DTI structure 134a is arranged directly below the STI structure 132, and a second DTI structure 134b is arranged directly below the same STI structure 132. In some embodiments, the BTSV 138 is arranged directly between the first DTI structure 134a and the second DTI structure 134b.

In some embodiments, the SOI substrate 104 has a thickness equal to a first distance $d_1$ that's measured from the backside 104b to the frontside 104f of the SOI substrate 104. In some embodiments, the first distance $d_1$ is in a range of between, for example, approximately 8 micrometers and approximately 15 micrometers. In some embodiments, the base layer 110 of the SOI substrate 104 has a thickness in a range of between, for example, approximately 2.5 micrometers and approximately 4 micrometers. In some embodiments, the base layer 110 comprises a semiconductor material such as, for example, silicon, germanium, a combination thereof, or some other suitable semiconductor material. In some embodiments, the insulator layer 112 has a thickness in a range of between, for example, approximately 3 kiloangstroms and approximately 4 kiloangstroms. In some embodiments, the insulator layer 112 comprises silicon oxide, silicon nitride, or some other suitable dielectric material. In some embodiments, the active layer 114 of the SOI substrate 104 has a thickness in a range of between, for example, approximately 5 micrometers and approximately 10 micrometers. In some embodiments, the active layer 114 comprises a semiconductor material such as, for example, silicon, germanium, a combination thereof, or some other suitable semiconductor material.

In some embodiments, the BTSV 138 has a height equal to a second distance $d_2$, wherein the second distance is greater than the first distance $d_1$ of the SOI substrate 104 because the BTSV 138 extends completely through the SOI substrate 104. In some embodiments, the second distance $d_2$ is in a range of between, for example, approximately 3 micrometers and approximately 9 micrometers and approximately 20 micrometers. In some embodiments, the BTSV 138 has a width equal to a third distance $d_3$ that is in a range of between, for example, approximately 3 micrometers and approximately 4 micrometers. In some embodiments, the BTSV 138 comprises copper, tungsten, aluminum, titanium, tantalum, cobalt, or some other suitable conductive material. In some embodiments, the BTSV 138 does not comprise polysilicon because voids may form within the polysilicon considering the large aspect ratio (e.g., height $d_2$ to width $d_3$) of the BTSV 138.

In some embodiments, the STI structures 132 and the DTI structure 134 comprise dielectric materials such as, for example, a nitride (e.g., silicon nitride, silicon oxynitride), a carbide (e.g., silicon carbide), an oxide (e.g., silicon oxide), borosilicate glass (BSG), phosphoric silicate glass (PSG), borophosphosilicate glass (BPSG), a low-k oxide (e.g., a carbon doped oxide, SiCOH), or the like. In some embodiments, the DTI structures 134 have a width equal to a fourth distance $d_4$ that is in a range of between, for example, approximately 0.6 micrometers and approximately 1.2 micrometers. In some embodiments, the DTI structures 134 are each spaced apart from the BTSV 138 by a portion of the active layer 114. In some embodiments, a fifth distance $d_5$ is arranged directly between each BTSV 138 and each DTI structure 134. In some embodiments, the fifth distance $d_5$ is in a range of between, for example, approximately 0.5 micrometers and approximately 1 micrometer.

In some embodiments, the isolation spacer structures 136 each have a width equal to a sixth distance $d_6$ that is in a range of between, for example, approximately 6 kiloangstroms and approximately 10 kiloangstroms. The BTSV 138 and the isolation spacer structures 136 arranged on either side of the BTSV 138 are arranged within a cavity of the base layer 110. In some embodiments, the cavity of the base layer 110 has a width equal to a seventh distance $d_7$ in a range of between, for example, approximately 4.2 micrometers and approximately 6 micrometers. In some embodiments, the isolation spacer structures 136 act as a diffusion barrier layer and/or electrical isolation layer between the BTSVs 138 and the base layer 110. In some embodiments, the isolation spacer structures 136 comprise titanium nitride, tantalum nitride, or some other dielectric material such as, for example, a nitride (e.g., silicon nitride, silicon oxynitride), a carbide (e.g., silicon carbide), an oxide (e.g., silicon oxide), borosilicate glass (BSG), phosphoric silicate glass (PSG), borophosphosilicate glass (BPSG), a low-k oxide (e.g., a carbon doped oxide, SiCOH), or the like.

Figure 3:
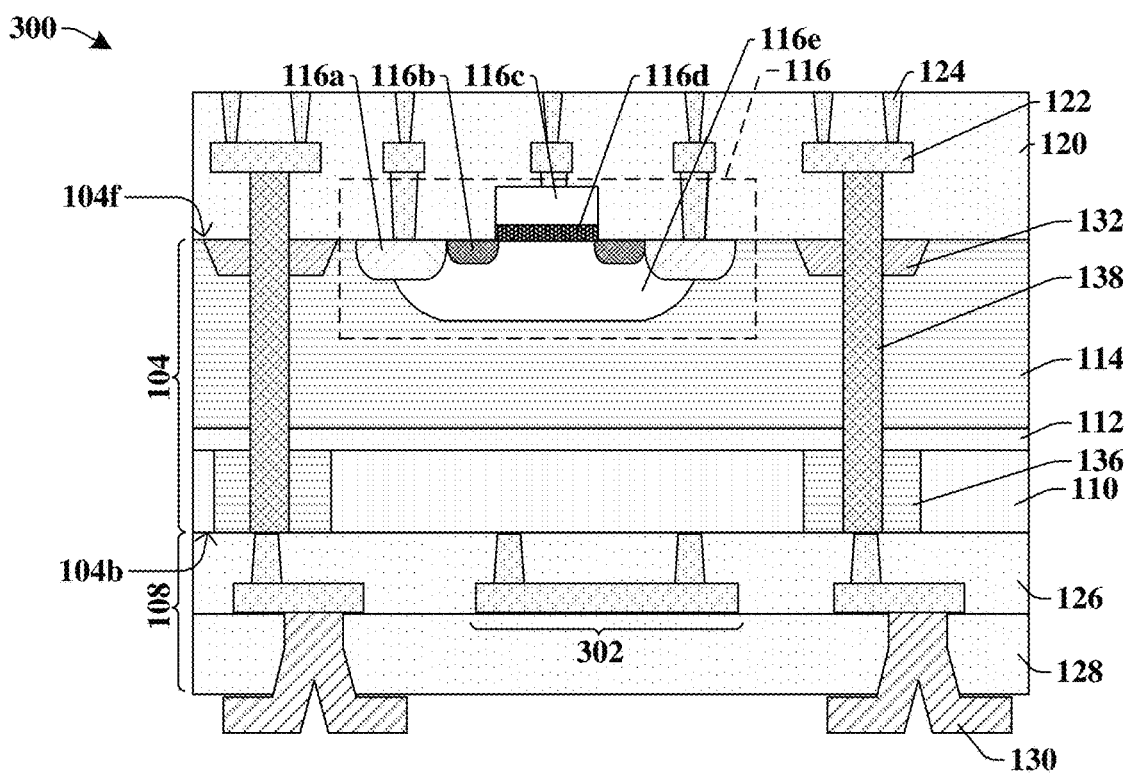

FIG. 3 illustrates a magnified, cross-sectional view 300 that corresponds some embodiments of box B of FIG. 1. The magnified, cross-sectional view 300 includes the second semiconductor device 116 of the first IC (102 of FIG. 1).

In some embodiments, the second semiconductor device 116 comprises a metal oxide semiconductor field effect transistor (MOSFET). In some such embodiments, the second semiconductor device 116 comprises a well region 116e within the SOI substrate 104; source/drain regions 116a near outer portions of the well region 116e; heavily doped source/drain regions 116b arranged within the well region 116e; a gate electrode 116c arranged over the SOI substrate 104 and between the source/drain regions 116a and the heavily doped source/drain regions 116b; and a gate dielectric layer 116d arranged directly between the gate electrode 116c and the SOI substrate 104. In some embodiments, the second semiconductor device 116 operates at low voltages compared to the first semiconductor device (118 of FIG. 2). For example, in some embodiments, the second semiconductor device 116 is configured to operate at voltages in a range of between about 1 volt and about 15 volts.

In some embodiments, the interconnect dielectric structure 120, the backside interconnect dielectric structure 126, and the backside dielectric layer 128 comprise dielectric materials such as, for example, a nitride (e.g., silicon nitride, silicon oxynitride), a carbide (e.g., silicon carbide), an oxide (e.g., silicon oxide), borosilicate glass (BSG), phosphoric silicate glass (PSG), borophosphosilicate glass (BPSG), a low-k oxide (e.g., a carbon doped oxide, SiCOH), or the like. In some embodiments, the interconnect wires 122, interconnect vias 124, and bond pad structures 130 comprise, for example, copper, aluminum, titanium, tantalum, tungsten, or some other suitable conductive material.

In some embodiments, the interconnect wires 122 and the interconnect vias 124 within the backside interconnect dielectric structure 126 contact the base layer 110 of the SOI substrate 104. Such interconnect wires 122 and interconnect vias 124 that touch the base layer 110 are labeled as a backside grounded isolation structure 302. In some such embodiments, the backside grounded isolation structure 302 of the backside interconnect dielectric structure 126 is grounded to ground the base layer 110 of the SOI substrate 104. By grounding the base layer 110 of the SOI substrate 104, the electrical potential of the base layer 110 is grounded which increases the breakdown voltage of the first semiconductor device (118 of FIG. 2) and the second semiconductor device 116 by reducing the surface field of the base layer 110.

Figure 4:
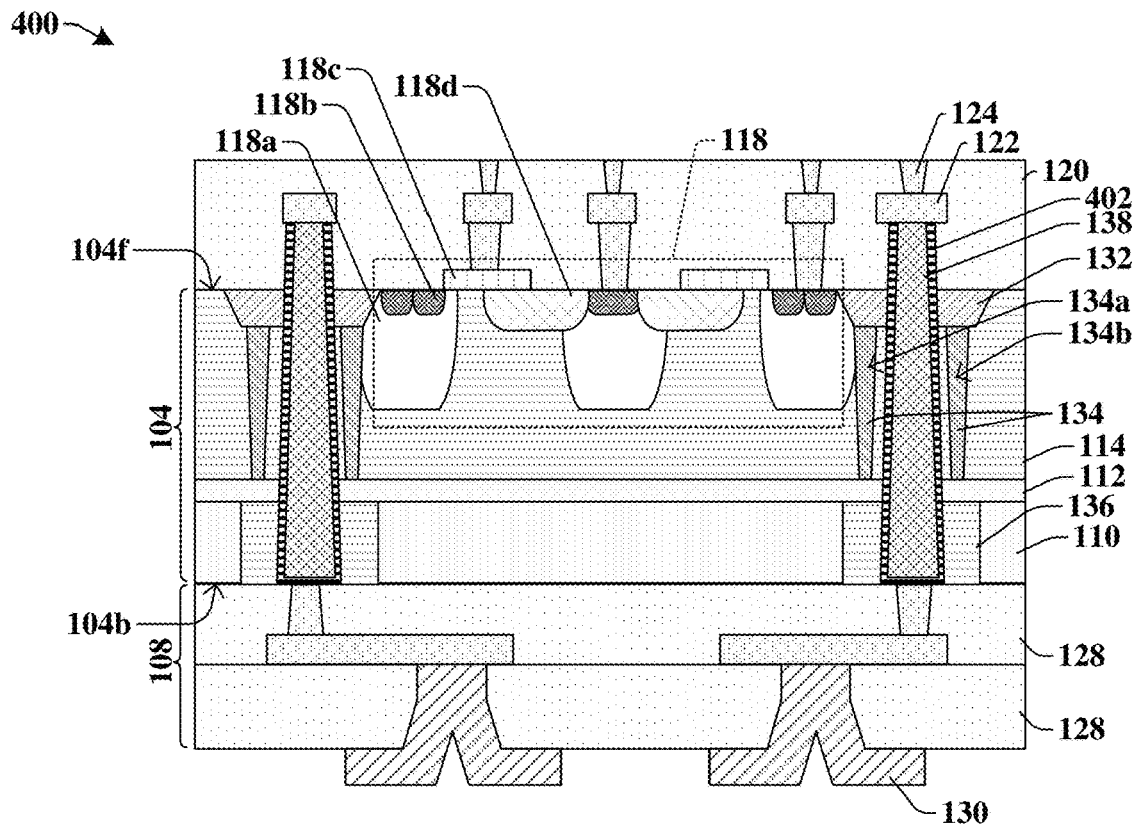
FIGS. 4 and 5 illustrate alternative embodiments of FIGS. 2 and 3, respectively.

FIG. 4 illustrates a cross-sectional view 400 of some alternative embodiments of the magnified, cross-sectional view 200 of FIG. 2.

In some embodiments, the BTSVs 138 have a tapered profile, wherein from the cross-sectional view 400 of FIG. 4, the width of the BSTV 138 continuously increases through the height of the BTSV 138 from a topmost surface of the BTSV 138 toward a bottommost surface of the BSTV 138. Because the BTSV 138 is formed from the backside 104b of the SOI substrate 104 toward the frontside 104f of the SOI substrate 104, it is the bottommost surface of the BTSV 138 that has the largest width. Further, in some embodiments, outer surfaces of the BTSV 138 are lined with a BTSV barrier layer 402. In some such embodiments, the BTSV barrier layer 402 comprises diffusion barrier and/or electrical isolation materials to mitigate cross-talk of the BTSV 138. In some such embodiments, the BTSV barrier layer 402 comprises a same or similar material as the isolation spacer structures 136.

Figure 5:
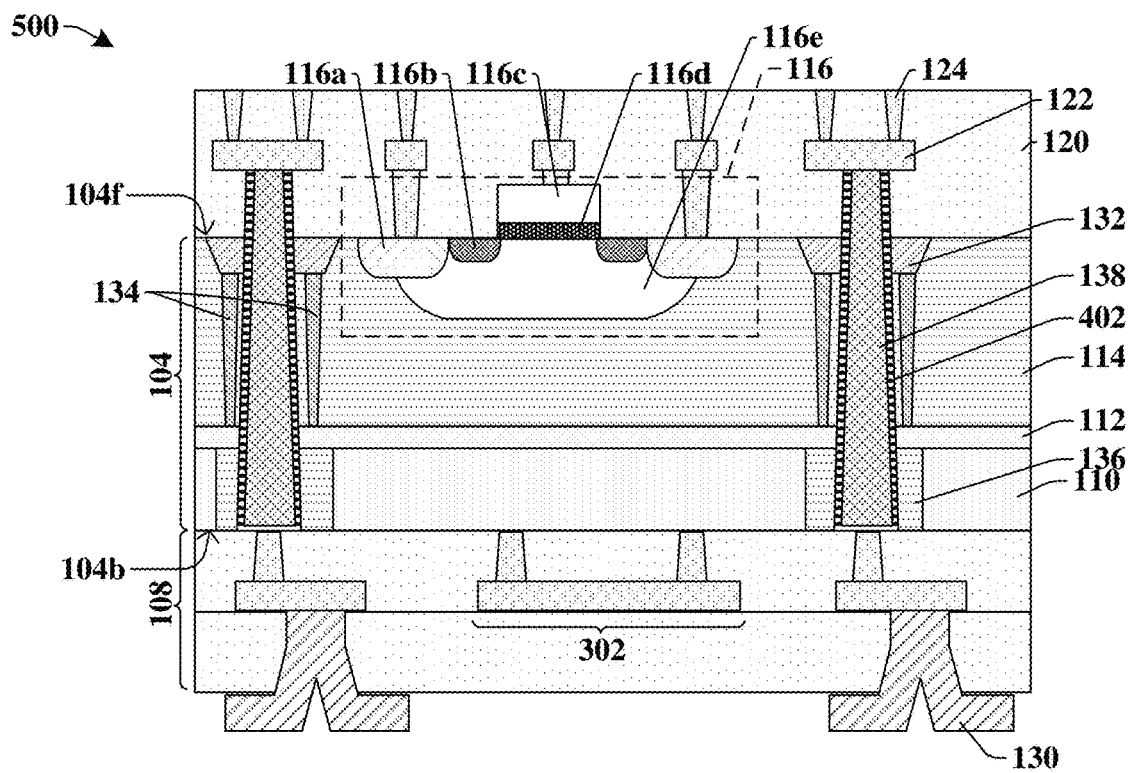

FIG. 5 illustrates a cross-sectional view 400 of some alternative embodiments of the magnified, cross-sectional view 500 of FIG. 5.

In some other embodiments, DTI structures 134 may also be arranged around the BTSVs 138 that surround the second semiconductor device 116. In some such embodiments, the DTI structures 134 ensure that the BTSVs 138 do not interfere with the second semiconductor device 116. However, in some embodiments, the presence of the DTI structures 134 around the second semiconductor device 116 may increase the area of the second semiconductor device 116 and surrounding features (e.g., 132, 134, 138, etc.) on the SOI substrate 104.

FIGS. 6-20 illustrate various views 600-2000 of some embodiments of a method of forming a device comprising a high-voltage device and a low-voltage device, wherein the high-voltage device is isolated using deep trench isolation structures. Although FIGS. 6-20 are described in relation to a method, it will be appreciated that the structures disclosed in FIGS. 6-20 are not limited to such a method, but instead may stand alone as structures independent of the method.

Figure 6:
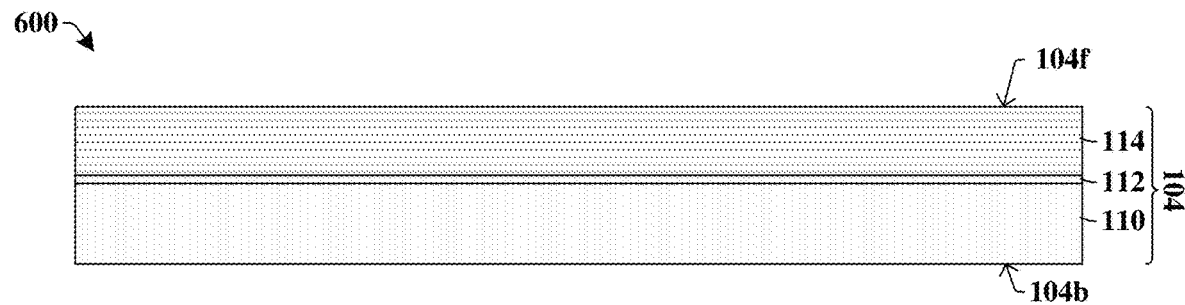
FIGS. 6-20 illustrate various views of some embodiments of a method of forming a device comprising a high-voltage device and a low-voltage device within the same device, wherein deep trench isolation structures surround the high-voltage device and backside through substrate vias couple the high-voltage device on a frontside of a substrate to circuitry arranged on a backside of the substrate.

As shown in cross-sectional view 600 of FIG. 6, a silicon-on-insulator (SOI) substrate 104 is provided. In some embodiments, the SOI substrate 104 comprises a base layer 110, an active layer 114 arranged over the base layer 110, and an insulator layer 112 arranged between the active layer 114 and the base layer 110. In some embodiments, the base layer 110 comprises a monocrystalline semiconductor material (e.g., silicon, germanium, etc.). Similarly, the active layer 114 may also comprise a semiconductor material, such as for example, silicon, germanium, or the like. In some embodiments, the active layer 114 may be doped.

In some embodiments, the active layer 114 has a thickness in a range of between, for example, approximately 5 micrometers and approximately 10 micrometers. In some embodiments, the insulator layer 112 may be a bulk oxide comprising, for example, silicon oxide. In other embodiments, the insulator layer 112 may comprise, for example, a nitride, a carbide, or some other dielectric material. The insulator layer 112 may have a thickness in a range of between, for example, approximately 3 kiloangstroms and approximately 4 kiloangstroms. In some embodiments, the base layer 110 has a thickness in a range of between, for example, approximately 3 micrometers and approximately 7 micrometers. In some embodiments, a frontside 104f of the SOI substrate 104 is defined by an exposed surface of the active layer 114, and a backside 104b of the SOI substrate 104 is defined by an exposed surface of the base layer 110.

Figure 7A:
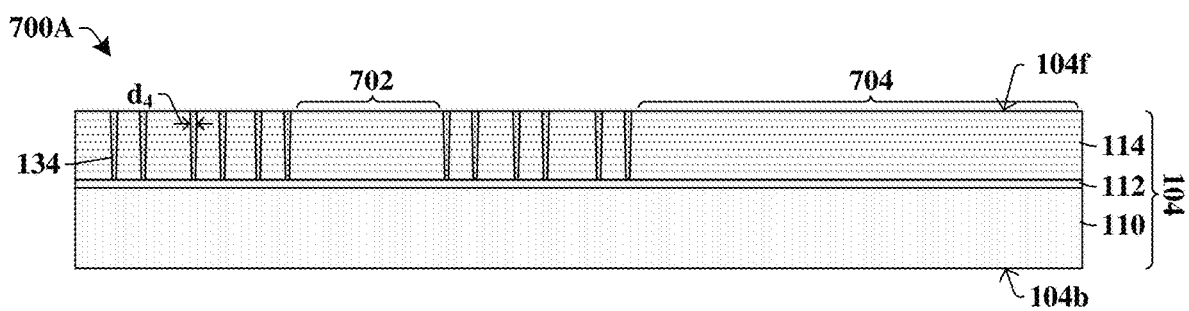

As shown in cross-sectional view 700A of FIG. 7A, in some embodiments, deep trench isolation (DTI) structures 134 are formed within the active layer 114 from the frontside 104f of the SOI substrate 104 to the insulator layer 112 of the SOI substrate 104. In some embodiments, the DTI structures 134 are formed through various steps of photolithography, removal (e.g., etching, planarization processes, etc.), and deposition processes (e.g., physical vapor deposition (PVD), chemical vapor deposition (CVD), PE-CVD, atomic layer deposition (ALD), sputtering, etc.) such that the DTI structures 134 comprise a dielectric material. For example, in some embodiments, the DTI structures 134 comprise a nitride (e.g., silicon nitride, silicon oxynitride), a carbide (e.g., silicon carbide), an oxide (e.g., silicon oxide), borosilicate glass (BSG), phosphoric silicate glass (PSG), borophosphosilicate glass (BPSG), a low-k oxide (e.g., a carbon doped oxide, SiCOH), or the like.

In some embodiments, the DTI structures 134 surround a high-voltage device region 702 of the SOI substrate 104. In some embodiments, a low-voltage device region 704 of the SOI substrate 104 remains substantially free of DTI structures 134 because low-voltage devices that may be formed within the low-voltage device region 704 do not need as much isolation as high-voltage devices. In some embodiments, the DTI structures 134 have a thickness measured in the lateral direction equal to a fourth distance $d_4$. The fourth distance $d_4$ must be thick enough to provide isolation but as thin as possible to preserve space on the SOI substrate 104. In some embodiments, the fourth distance $d_4$ is in a range of between, for example, approximately 0.6 micrometers and approximately 1.2 micrometers.

Figure 7B:
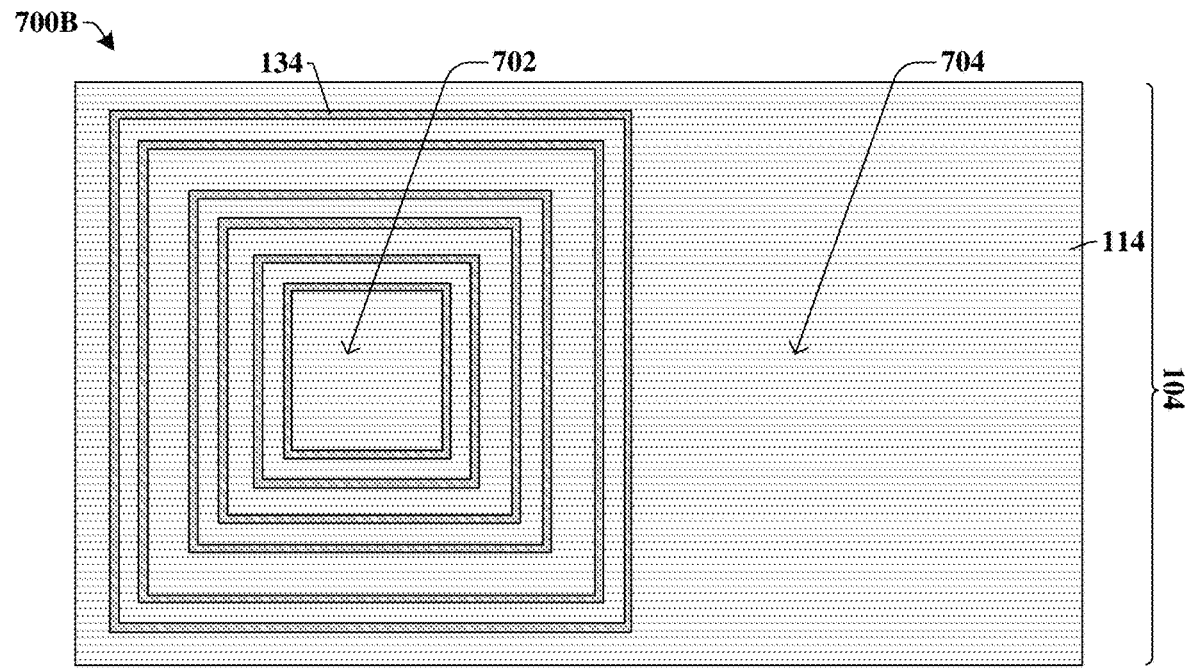

FIG. 7B illustrates a top-view 700B of some embodiments that may correspond to the cross-sectional view 700A of FIG. 7A.

As shown in FIG. 7B, in some embodiments, each DTI structure 134 is a continuously connected, ring-like structure. Therefore, in some embodiments, the DTI structures 134 continuously surround and define the high-voltage device region 702 of the active layer 114 of the SOI substrate 104.

Figure 7C:
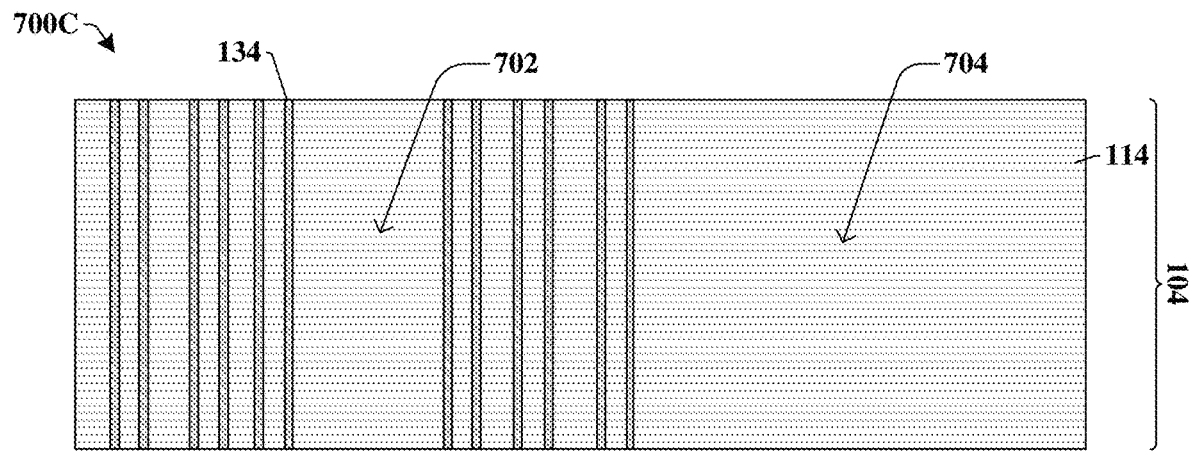

FIG. 7C illustrates a top-view 700C of some other embodiment that may correspond to the cross-sectional view 700A of FIG. 7A.

As shown in FIG. 7C, in some other embodiments, each DTI structure 134 runs in parallel with one another from a first side of the SOI substrate 104 to a second side of the SOI substrate 104. In some such embodiments, the DTI structures 134 continuously surround two sides of the high-voltage device region 702 of the active layer 114 of the SOI substrate 104 instead of all four sides as shown in FIG. 7B.

Figure 8:
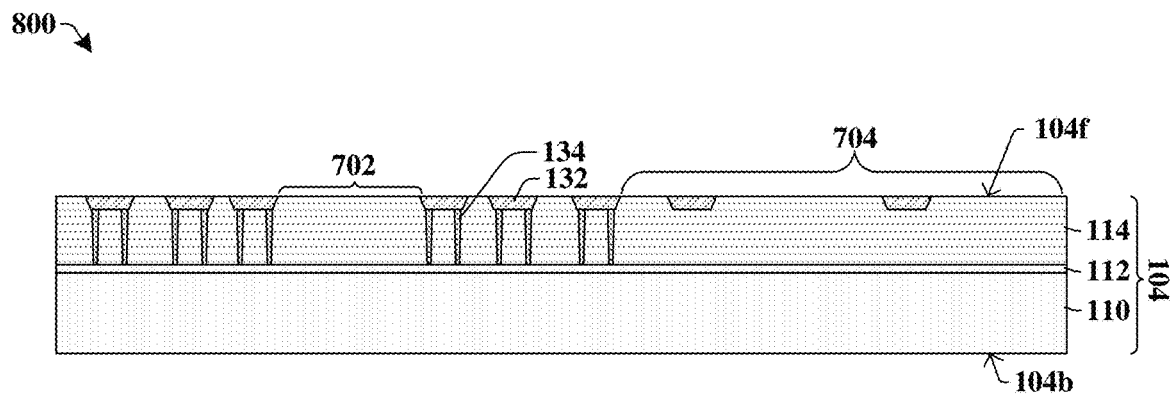

As shown in cross-sectional view 800 of FIG. 8, in some embodiments, shallow trench isolation (STI) structures 132 are formed within the SOI substrate 104. The STI structures 132 extend from the frontside 104f of the SOI substrate 104 toward the backside 104b of the SOI substrate 104. Because the STI structures 132 do not extend all the way through the active layer 114 of the SOI substrate 104, a depth of the STI structures 132 is less than the thickness of the active layer 114. In some embodiments, the STI structures 132 are formed through various steps of photolithography, removal, and/or deposition processes such that the STI structure 132 comprises a dielectric material. For example, in some embodiments, the STI structure 132 comprises a nitride (e.g., silicon nitride, silicon oxynitride), a carbide (e.g., silicon carbide), an oxide (e.g., silicon oxide), borosilicate glass (BSG), phosphoric silicate glass (PSG), borophosphosilicate glass (BPSG), a low-k oxide (e.g., a carbon doped oxide, SiCOH), or the like. In other embodiments, the STI structure 132 may be formed by a selective ion implantation process such that the STI structure 132 has a different dopant concentration than the active layer 114.

In some such embodiments, each STI structure 132 is formed over two DTI structures 134. Further, in some embodiments, the STI structures 132 have a same top-view pattern as the DTI structures 134. Thus, in some embodiments, the STI structures 132 may also be continuously connected, ring-like structures similar to the DTI structures 134 in FIG. 7B. In some embodiments, one or more STI structures 132 are also formed on the low-voltage device region 704 of the SOI substrate 104. In some such embodiments, the STI structures 132 are not formed over DTI structures 134. Nevertheless, in some embodiments, all STI structures 132 of FIG. 8 may be formed simultaneously for manufacturing efficiency. Further, it will be appreciated that in some other embodiments, the STI structures 132 are formed before the DTI structures 134.

Figure 9:
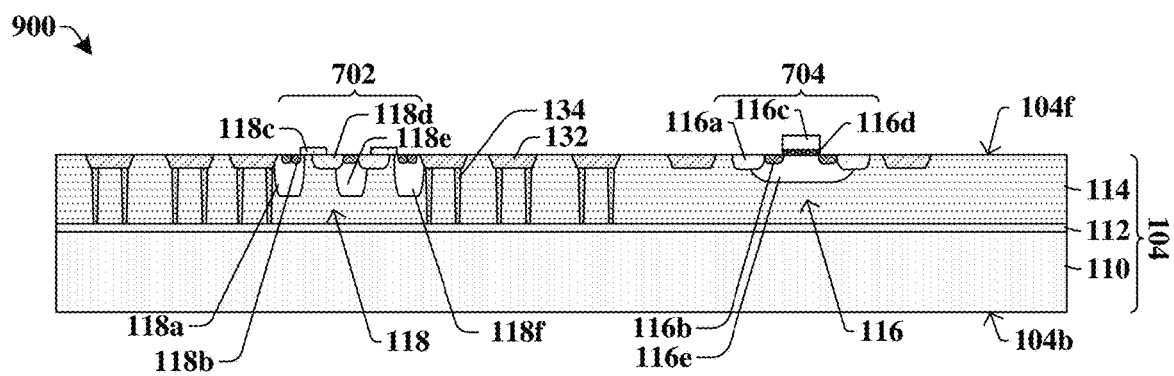

As shown in cross-sectional view 900 of FIG. 9, in some embodiments, a first semiconductor device 118 is formed on the frontside 104f of the SOI substrate 104 and within the high-voltage device region 702 of the SOI substrate 104 that is surrounded by the DTI structures 134. Further, in some embodiments, a second semiconductor device 116 is formed on the frontside 104f of the SOI substrate 104 and within the low-voltage device region 704 of the SOI substrate 104 that is surrounded by at least the STI structures 132. In some embodiments, the first semiconductor device 118 is a high-voltage device meaning that it is configured to operate at voltages greater than about 100 volts. In some embodiments, the second semiconductor device 116 is configured to operate at voltages less than 100 volts. Thus, in some embodiments, the second semiconductor device 116 is configured to operate at voltages lower than the first semiconductor device 118. In some embodiments, the first and/or second semiconductor devices 118, 116 may be or comprise, for example, metal oxide semiconductor field effect transistors (MOSFET), finFETs, gate all around FETs, BCDs, or some other suitable semiconductor device.

As an example, in FIG. 9, the first semiconductor device 118 is a BCD device. The BCD device may comprise a lightly doped region 118a within the active layer 114 of the SOI substrate 104, densely doped regions 118b within upper areas of the active layer 114 of the SOI substrate 104, a drain region 118f spaced apart from the lightly doped region 118a, and a source region 118e arranged between the lightly doped region 118a and the drain region 118f. Further, in some embodiments, gate electrodes 118c are arranged over the frontside 104f of the SOI substrate 104 and between the lightly doped region 118a and the source region 118e and between the lightly doped region 118a and the drain region 118f. In some embodiments, the BCD device (e.g., the first semiconductor device 118) may further comprise dielectric structures 118d on or within the active layer 114 of the SOI substrate 104 between the lightly doped region 118a and the source region 118e and between the lightly doped region 118a and the drain region 118f.

As an example, in FIG. 9, the second semiconductor device 116 comprises a MOSFET device. In some such embodiments, the second semiconductor device 116 comprises a well region 116e within the SOI substrate 104; source/drain regions 116a near outer portions of the well region 116e; heavily doped source/drain regions 116b arranged within the well region 116e; a gate electrode 116c arranged over the SOI substrate 104 and between the source/drain regions 116a and the heavily doped source/drain regions 116b; and a gate dielectric layer 116d arranged directly between the gate electrode 116c and the SOI substrate 104.

The first and second semiconductor devices 118, 116 may be formed through various steps of photolithography, removal (e.g., etching, planarization processes, etc.), ion implantation/doping, and deposition processes (e.g., PVD, CVD, ALD, sputtering, etc.). In some embodiments, at least the formation of the first semiconductor device 118 comprises high-processing temperatures and more deposition and removal processes than the formation of lower voltage operating devices (e.g., the second semiconductor device 116). Thus, the second semiconductor device 116 arranged on the same SOI substrate 104 as the first semiconductor device 118 must withstand such complex processing steps of forming the first semiconductor device 118, in some embodiments. In some other embodiments, the first semiconductor device 118 may be formed before forming the second semiconductor device 116 to mitigate damage to the second semiconductor device 116 from the complex processing steps to form the first semiconductor device 118.

Figure 10:
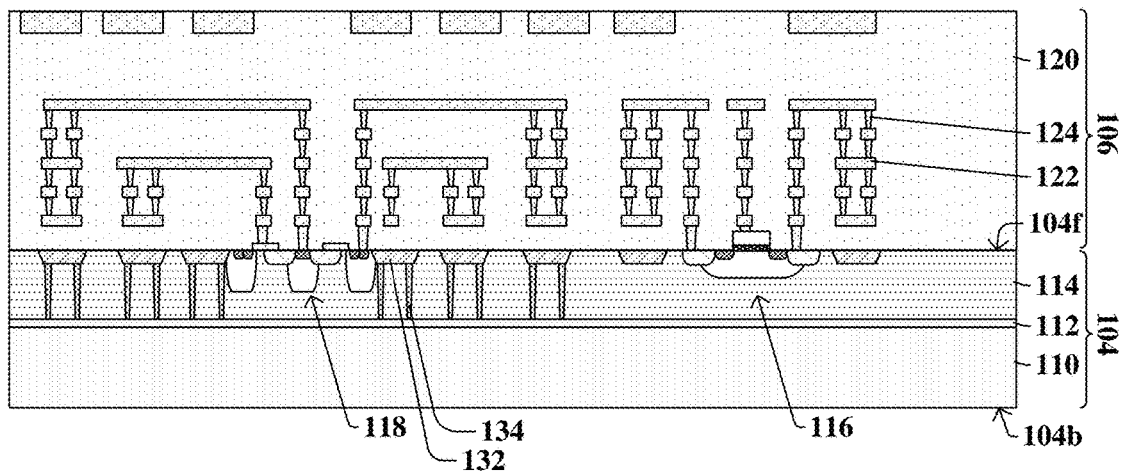

As shown in cross-sectional view 1000 of FIG. 10, in some embodiments, a first interconnect structure 106 is formed over the frontside 104f of the SOI substrate 104. In some embodiments, the first interconnect structure 106 comprises a network interconnect wires 122 and interconnect vias 124 embedded within an interconnect dielectric structure 120. In some embodiments, the first interconnect structure 106 is formed through various steps of photolithography, removal (e.g., etching, planarization processes, etc.), and deposition processes (e.g., PVD, CVD, ALD, sputtering, etc.). In some embodiments, the interconnect wires 122 and the interconnect vias 124 may be formed through single damascene or dual damascene processes. In some embodiments, the interconnect wires 122 and the interconnect vias 124 are electrically coupled to features of the first semiconductor device 118 and the second semiconductor device 116. In some embodiments, the interconnect wires 122 and the interconnect vias 124 comprise a conductive material such as, for example, copper, aluminum, titanium, tantalum, tungsten, or some other suitable conductive material. In some embodiments, barrier and/or diffusion liner layers (not shown) separate the interconnect wires 122 and the interconnect vias 124 from the interconnect dielectric structure 120. In some embodiments, the interconnect dielectric structure 120 comprises a dielectric structure such as, for example, a nitride (e.g., silicon nitride, silicon oxynitride), a carbide (e.g., silicon carbide), an oxide (e.g., silicon oxide), borosilicate glass (BSG), phosphoric silicate glass (PSG), borophosphosilicate glass (BPSG), a low-k oxide (e.g., a carbon doped oxide, SiCOH), or the like. In some embodiments, the interconnect dielectric structure 120 comprises multiple layers of dielectric layers, wherein the dielectric layers may be spaced apart from one another by etch stop layers.

Figure 11:
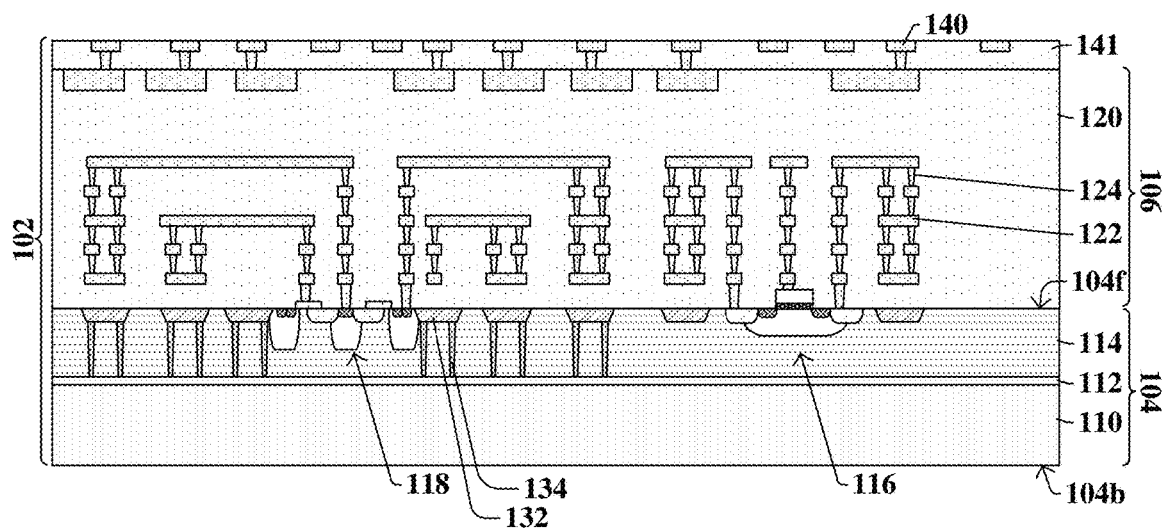

As shown in cross-sectional view 1100 of FIG. 11, in some embodiments, a first bonding interconnect layer 141 is formed over the first interconnect structure 106. In some embodiments, first hybrid bonding structures 140 and interconnect vias 124 are formed within the first bonding interconnect layer 141. In some embodiments, the first bonding interconnect layer 141 is formed by way of a deposition process (e.g., PVD, CVD, ALD, sputtering, etc.). In some embodiments, the first hybrid bonding structures 140 and interconnect vias 124 are formed through various steps of photolithography, removal (e.g., etching, planarization processes, etc.), and deposition processes (e.g., PVD, CVD, ALD, sputtering, etc.). In some embodiments, the first bonding interconnect layer 141 comprises a dielectric material such as a same or similar dielectric material as the interconnect dielectric structure 120. In some embodiments, the first hybrid bonding structures 140 may comprise a conductive material such as, for example, copper, aluminum, tungsten, tantalum, titanium, or the like. In some embodiments, the first hybrid bonding structures 140 are coupled to the interconnect wires 122 and the interconnect vias 124 of the first interconnect structure 106. In some embodiments, the SOI substrate 104, the first interconnect structure 106, the first bonding interconnect layer 141, and first hybrid bonding structures 140 form a first integrated chip (IC) 102.

Figure 12:
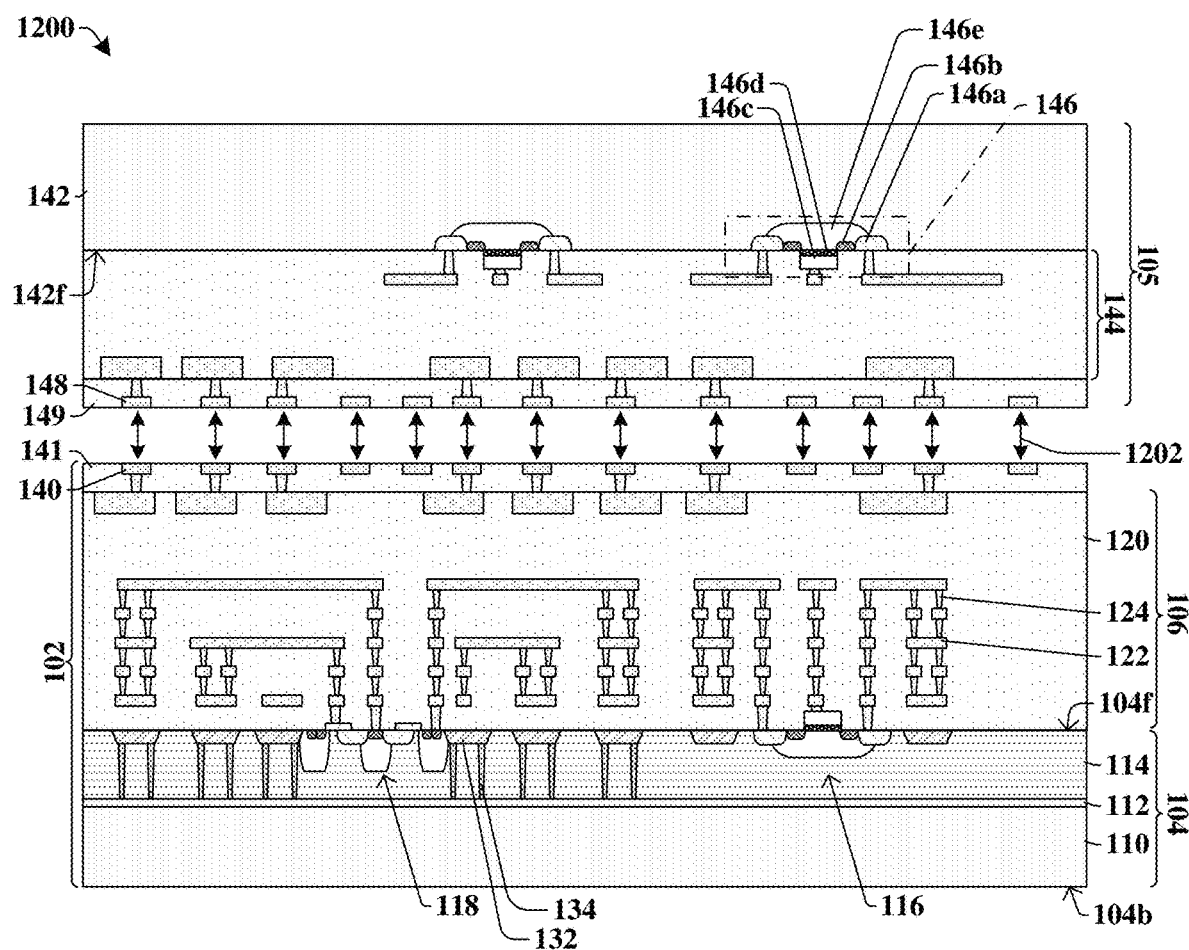

As shown in cross-sectional view 1200 of FIG. 12, in some embodiments, a second IC 105 is provided, and a bonding process 1202 is performed to bond the second IC 105 to the first IC 102. In some embodiments, the second IC 105 includes, for example, a second interconnect structure 144 arranged over a second substrate 142. The second interconnect structure 144 may comprise the same or similar features (e.g., interconnect wires 122, interconnect vias 124, interconnect dielectric structure 120) and be formed using the same or similar processes as the first interconnect structure 106. In some embodiments, the second IC 105 further comprises a third semiconductor device 146 disposed on and/or within a frontside 142f of the second substrate 142, wherein the third semiconductor device 146 is coupled to the second interconnect structure 144.

In some embodiments, the third semiconductor device 146 is a metal oxide semiconductor field effect transistor (MOSFET) that comprises, for example, source/drain regions 146a arranged within the second substrate 142, a gate electrode 146c arranged over the second substrate 142 and between the source/drain regions 146a, and a gate dielectric layer 146d arranged between the second substrate 142 and the gate electrode 146c. In some embodiments, the third semiconductor device 146 further comprises source/drain extension regions 146b within the second substrate 142 and between the source/drain regions 146a and the gate electrode 146c. In some embodiments, the source/drain regions 146a and the source/drain extension regions 146b are arranged within a well region 146e of the second substrate 142. In some embodiments, the third semiconductor device 146 is formed through various steps of photolithography, removal (e.g., etching, planarization processes, etc.), ion implantation/doping, and deposition processes (e.g., PVD, CVD, ALD, sputtering, etc.). It will be appreciated that in some other embodiments, the third semiconductor device 146 is some other device such as, for example, a finFET, a GAAFET, or some other suitable semiconductor device.

In some embodiments, a second bonding interconnect layer 149 is arranged on the second interconnect structure 144, and second hybrid bonding structures 148 are formed within the second bonding interconnect layer 149. The second bonding interconnect layer 149 and the second hybrid bonding structures 148 may comprise similar materials and have similar formation processes as the first bonding interconnect layer 141 and the first hybrid bonding structures 140, respectively. After the formation of the second IC 105, the bonding process 1202 is performed to bond the first IC 102 to the second IC 105 through the first and second hybrid bonding structures 148, 140. In some embodiments, the bonding process 1202 is a fusion bonding process, a eutectic bonding process, a metallic bonding process, and/or a combination thereof (e.g., a hybrid bonding process). Because the frontside 142f of the second substrate 142 is facing the frontside 104f of the SOI substrate 104, the first IC 102 and the second IC 105 are face-to-face bonded to one another.

In some embodiments, the third semiconductor device 146 is configured to operate at lower voltages than the first semiconductor device 118. In some such embodiments, the third semiconductor device 146 has a less complex method of manufacturing than the first semiconductor device 118. For example, in some embodiments, the third semiconductor device 146 may be manufactured at lower temperatures than the first semiconductor device 118 because the third semiconductor device 146 is a lower voltage device than the first semiconductor device 118. Therefore, the third semiconductor device 146 is advantageously formed on a different substrate (the second substrate 142) than the first semiconductor device 118 such that the third semiconductor device 146 is not damaged by the high temperatures used to form the first semiconductor device 118 on the SOI substrate 104. Further, because the first IC 102 is bonded to the second IC 105 in the vertical direction to form a 3DIC, the first semiconductor device 118 can be integrated with the third semiconductor device 146 without sacrificing device density.

Figure 13:
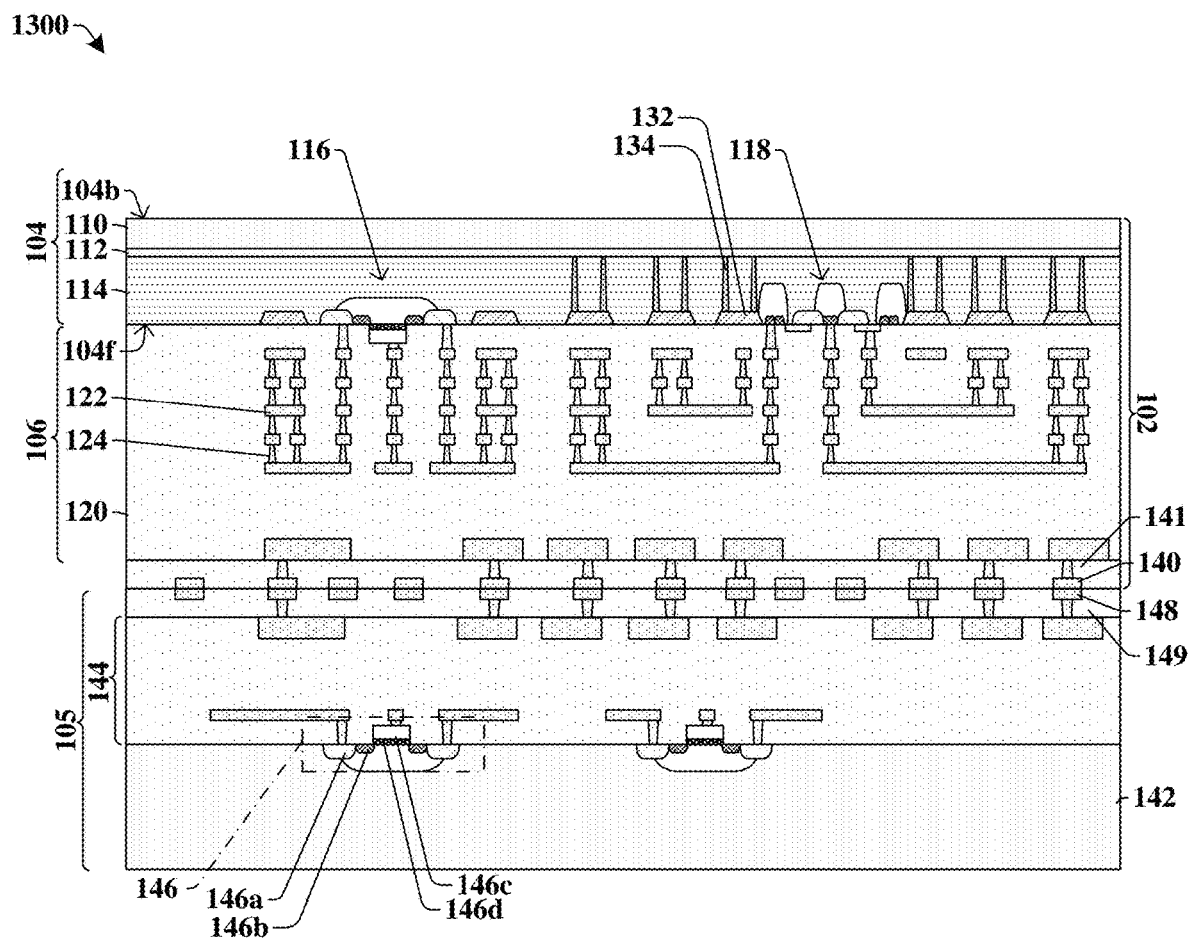

As shown in cross-sectional view 1300 of FIG. 13, in some embodiments, the structure of FIG. 12 is flipped around such that the backside 104b of the SOI substrate 104 can be patterned. In some embodiments, after the first IC 102 is bonded to the second IC 105, the base layer 110 of the SOI substrate 104 is thinned down using a thinning process (e.g., chemical mechanical planarization (CMP)) from the backside 104b of the SOI substrate 104. In some embodiments, after the thinning process of FIG. 13, the base layer 110 has a thickness in a range of between, for example approximately 2.5 micrometers and approximately 4 micrometers.

Figure 14:
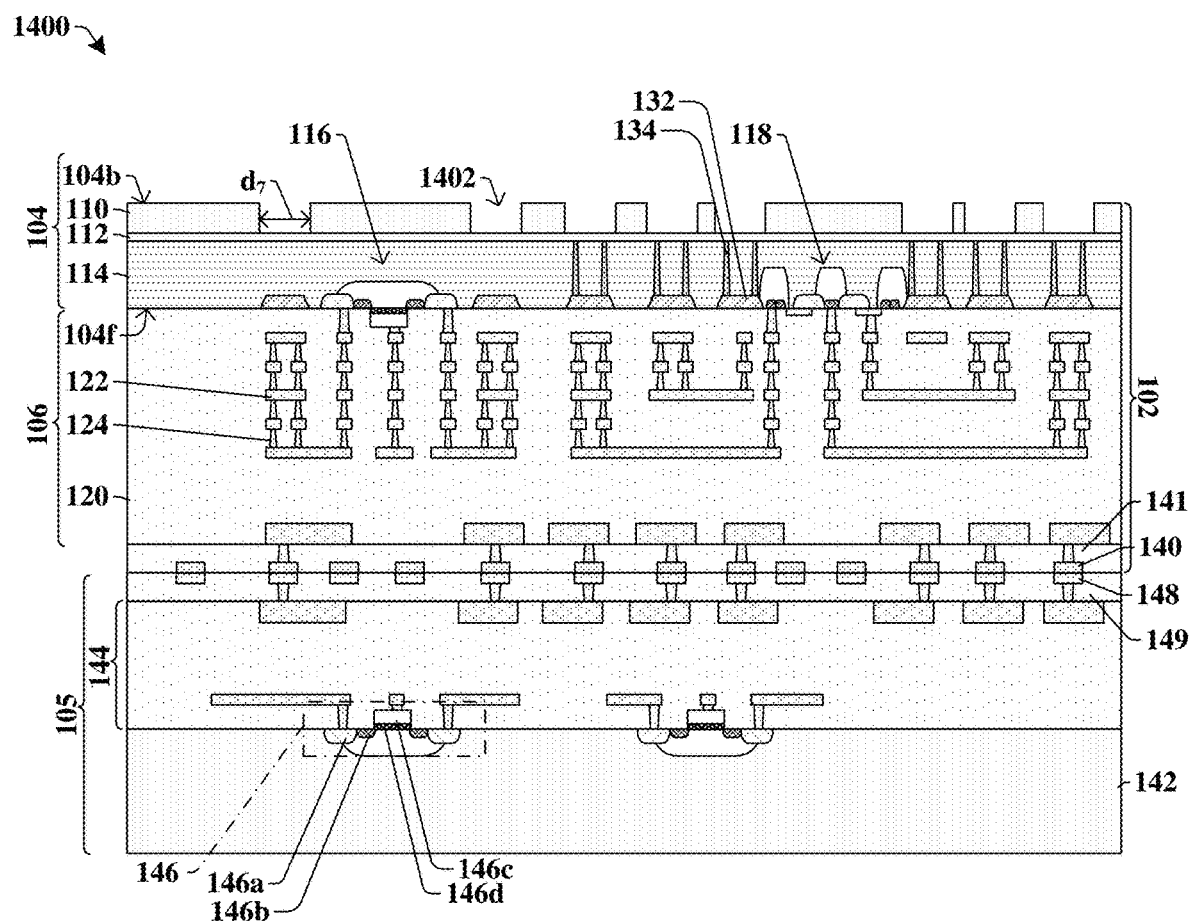

As shown in cross-sectional view 1400 of FIG. 14, in some embodiments, portions of the base layer 110 are removed to form first openings 1402 within the base layer 110 that expose the insulator layer 112. In some embodiments, the first openings 1402 are formed within the base layer 110 through photolithography and removal (e.g., etching) processes. In some embodiments, the insulator layer 112 is substantially resistant to removal by the etchant used to remove portions of the base layer 110. In other words, the insulator layer 112 acts as an etch stop layer such that bottom surfaces of the first openings 1402 are defined by the insulator layer 112. Inner sidewalls of the base layer 110 define outer sidewalls of the first openings 1402. In some embodiments, the first openings 1402 are arranged directly over each STI structure 132. Further, in some embodiments, the first openings 1402 are wide enough to be arranged over each DTI structure 134. In some embodiments, the first openings 1402 have a width equal to a seventh distance $d_7$ that is in a range of between, for example, approximately 4.2 micrometers and approximately 6 micrometers.

Figure 15:
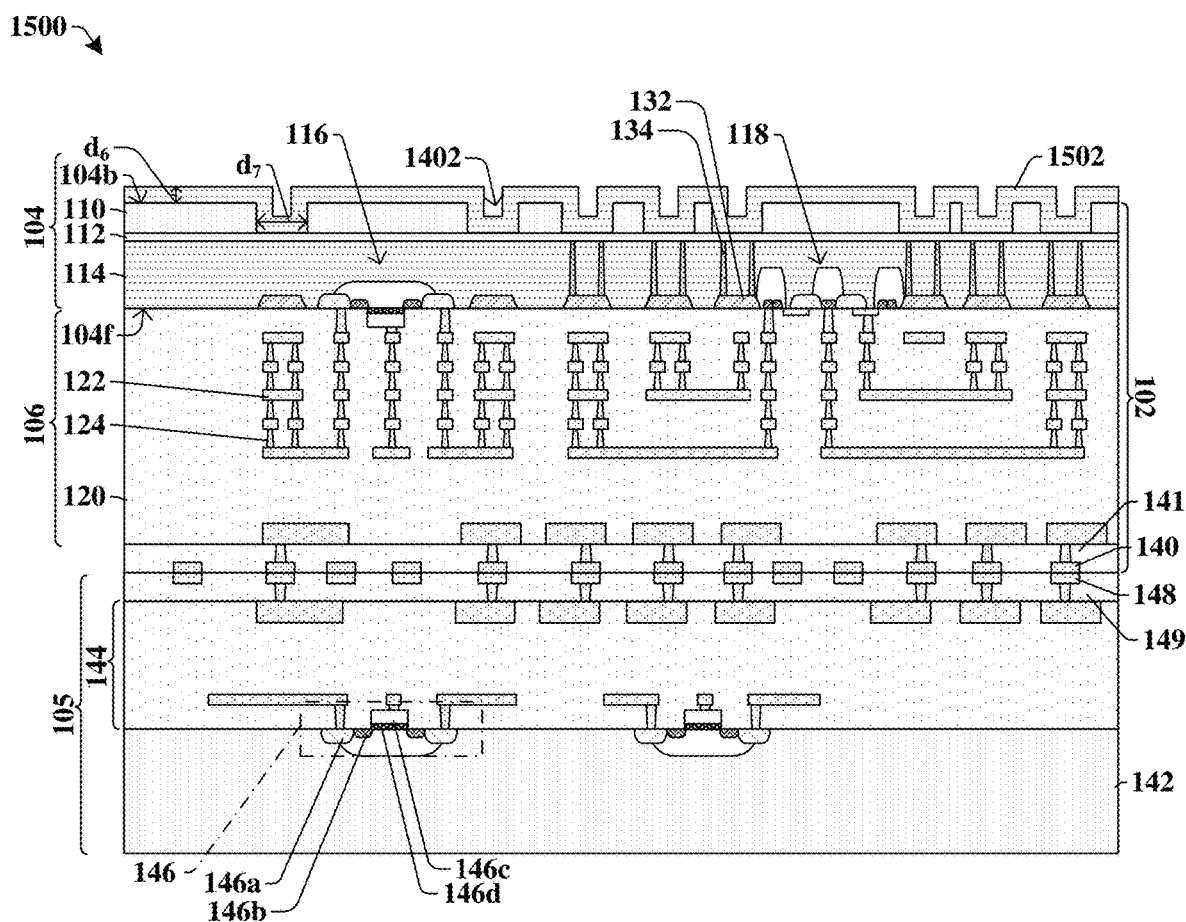

As shown in cross-sectional view 1500 of FIG. 15, in some embodiments, a conformal isolation layer 1502 is formed over the backside 104b of the SOI substrate 104 and within the first openings 1402 of the base layer 110. In some embodiments, the conformal isolation layer 1502 is formed by way of a deposition process (e.g., PVD, CVD, ALD, sputtering, etc.) and is formed to have a thickness equal to a sixth distance $d_6$. In some embodiments, the sixth distance $d_6$ is in a range of between, for example, approximately 6 kiloangstroms and approximately 10 kiloangstroms. In some embodiments, the sixth distance $d_6$ is less than one-half of the seventh distance $d_7$ such that the conformal isolation layer 1502 does not completely fill in the first openings 1402 of the base layer 110. In some embodiments, the conformal isolation layer 1502 comprises a diffusion barrier and/or electrical isolation material. For example, some embodiments, the isolation spacer structures 136 comprise titanium nitride, tantalum nitride, or some other dielectric material such as, for example, a nitride (e.g., silicon nitride, silicon oxynitride), a carbide (e.g., silicon carbide), an oxide (e.g., silicon oxide), borosilicate glass (BSG), phosphoric silicate glass (PSG), borophosphosilicate glass (BPSG), a low-k oxide (e.g., a carbon doped oxide, SiCOH), or the like.

Figure 16:
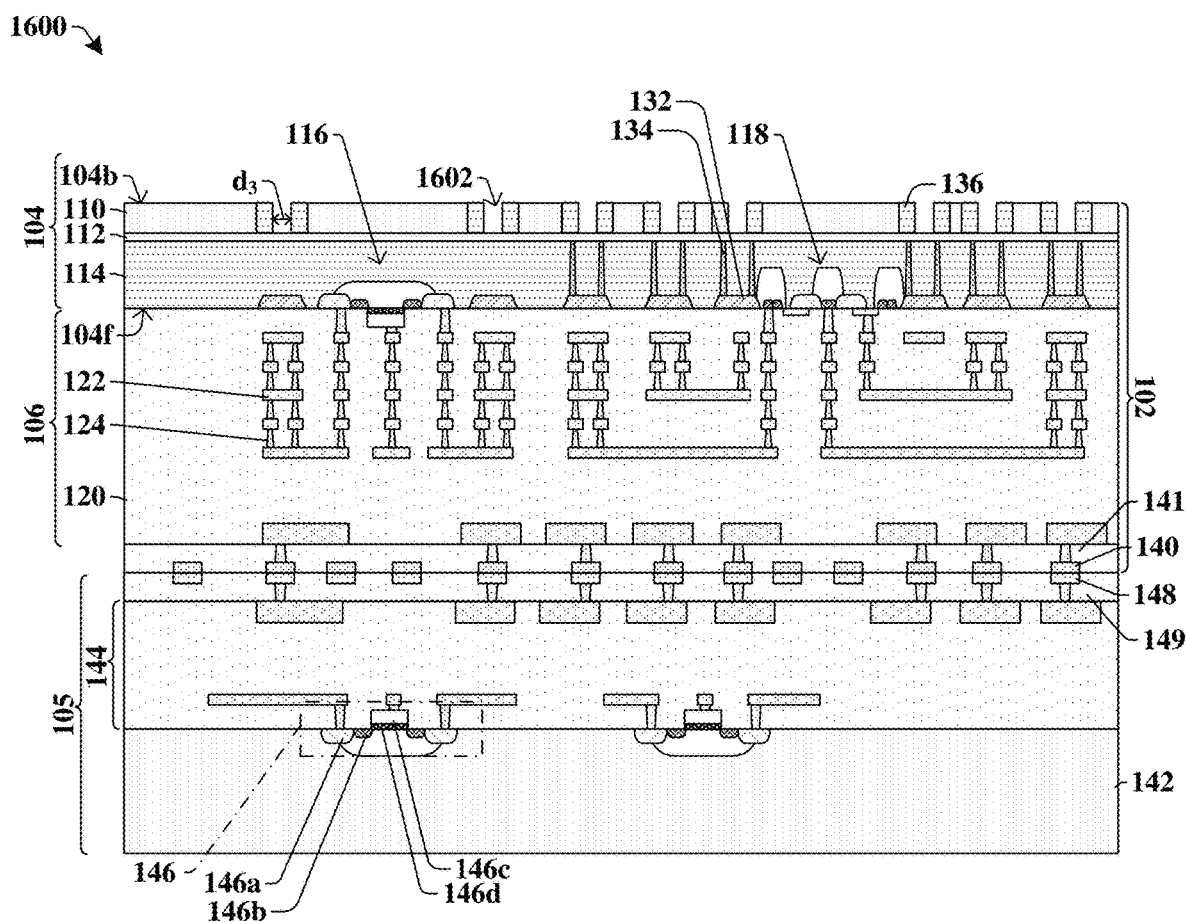

As shown in cross-sectional view 1600 of FIG. 16, in some embodiments, a removal process is performed to substantially horizontal portions of the conformal isolation layer (1502 of FIG. 15) to form isolation spacer structures 136 lining inner sidewalls of the base layer 110. In some embodiments, the removal process comprises dry etching that is performed in the vertical direction. In some such embodiments, a masking structure is not needed because the removal process is configured to remove the material of the isolation spacer structures 136 and not the base layer 110 or the insulator layer 112. In some embodiments, after the removal process of FIG. 16, second openings 1602 are formed within the base layer 110. The second openings 1602 have outer sidewalls defined by inner sidewalls of the isolation spacer structures 136 and have bottom surfaces defined by the insulator layer 112. The second openings 1602 directly overlie the STI structures 132 but do not directly overlie the DTI structures 134. The second openings 1602 are narrower than the first openings (1402 of FIG. 14). In some embodiments, the second openings 1602 have a width equal to a third distance $d_3$ that is in a range of between, for example, approximately 3 micrometers and approximately 4 micrometers.

Figure 17:
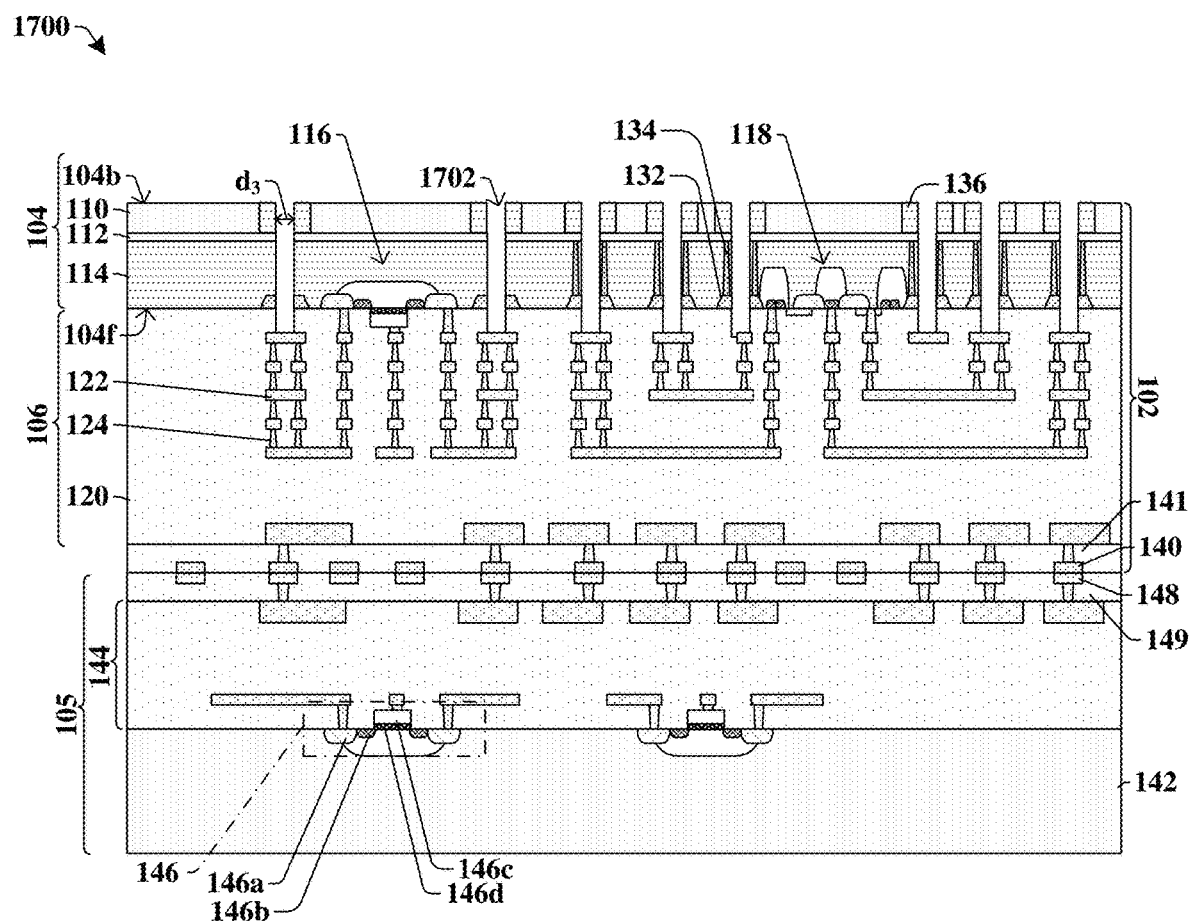

As shown in cross-sectional view 1700 of FIG. 17, in some embodiments, a removal process is performed to remove portions of the insulator layer 112, the active layer 114, the STI structures 132, and the interconnect dielectric structure 120 according to the second openings (1602 of FIG. 16) to form third openings 1702 within the first IC 102. The third openings 1702 extend from the backside 104b of the SOI substrate 104 and toward the interconnect wires 122 or interconnect vias 124 of the first interconnect structure 106. Thus, the third openings 1702 expose the interconnect wires 122 or interconnect vias 124 of the first interconnect structure 106. In some embodiments, the removal process of FIG. 17 comprises a different removal process than FIG. 16 such that the isolation spacer structures 136 do not keep getting removed during the removal process of FIG. 17. In some embodiments, a same etchant is used to remove the portions of the insulator layer 112, the active layer 114, the STI structures 132, and the interconnect dielectric structure 120 during the removal process of FIG. 17, whereas in some other embodiments, at least two etchants may be used to remove the portions of the insulator layer 112, the active layer 114, the STI structures 132, and the interconnect dielectric structure 120 during the removal process of FIG. 17. In some embodiments, the third openings 1702 have a width equal to the third distance $d_3$. In some embodiments, some of the third openings 1702 have portions surrounded by the DTI structures 134.

Figure 18:
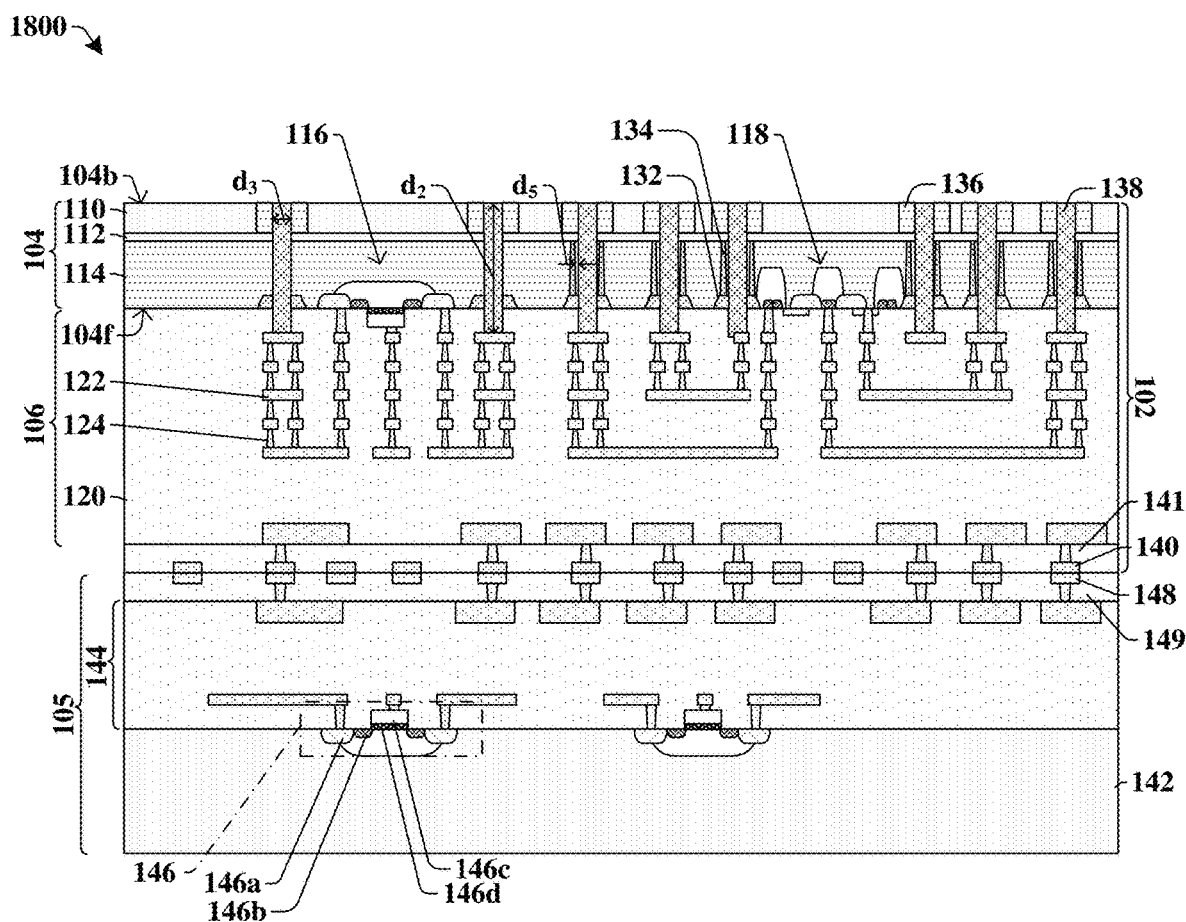

As shown in cross-sectional view 1800 of FIG. 18, in some embodiments, backside through substrate vias (BTSVs) 138 are formed within the third openings (1702 of FIG. 17). In some embodiments, the BTSVs 138 are formed by first forming a conductive material (e.g., PVD, CVD, ALD, sputtering, etc.) over the backside 104b of the SOI substrate 104 to completely fill the third openings (1702 of FIG. 17) followed by a removal process (e.g., CMP) to remove portions of the conductive material arranged over the backside 104b of the SOI substrate 104. In some embodiments, the BTSVs 138 comprise copper, tungsten, aluminum, titanium, tantalum, cobalt, or some other suitable conductive material. The BTSVs 138 are electrically coupled to the interconnect wires 122 and interconnect vias 124 of the first interconnect structure 106 such that the BTSVs 138 are coupled to the first and second semiconductor devices 118, 116.

In some embodiments, the BTSVs 138 have a height equal to a second distance $d_2$ that is in a range of between, for example, approximately 3 micrometers and approximately 9 micrometers and approximately 20 micrometers. In some embodiments, the BTSVs 138 that are arranged directly between the DTI structures 134 are spaced apart from the DTI structures 134 by a fifth distance $d_5$. In some embodiments, the fifth distance $d_5$ is in a range of between, for example, approximately 0.5 micrometers and approximately 1 micrometer. The DTI structures 134 at least surround the BTSVs 138 that are coupled to the first semiconductor device 118 such that the high voltages that travel through the BTSVs 138 and to/from the first semiconductor device 118 do not leak into the active layer 114 and cause cross-talk. Further, in some embodiments, the isolation spacer structures 136 prevent the BTSVs 138 from diffusing into the base layer 110.

Figure 19:
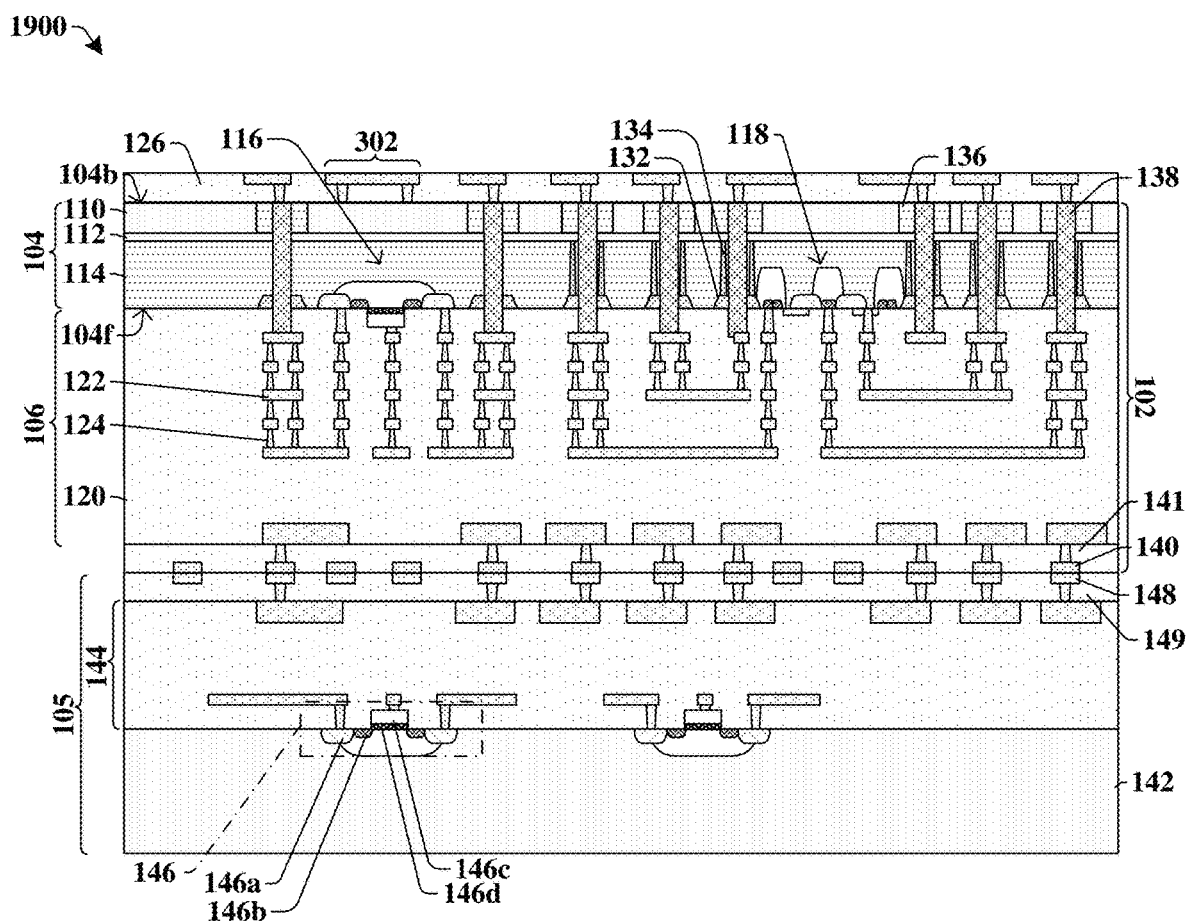

As shown in cross-sectional view 1900 of FIG. 19, in some embodiments a backside interconnect dielectric structure 126 comprising interconnect vias 124 and interconnect wires 122 is formed on the backside 104b of the SOI substrate 104. In some embodiments, the interconnect wires 122 and the interconnect vias 124 within the backside interconnect dielectric structure 126 are electrically coupled to the BTSVs 138. In some embodiments, the backside interconnect dielectric structure 126 and the interconnect wires and vias 122, 124 within the backside interconnect dielectric structure 126 are formed using the same or similar materials and processes as the first interconnect structure 106.

In some embodiments, an interconnect wire 122 and an interconnect vias 124 arranged within the backside interconnect dielectric structure 126 do not contact one of the BTSVs 138 but instead contacts the base layer 110 of the SOI substrate 104. Such interconnect wires 122 and interconnect vias 124 that touch the base layer 110 are labeled as a backside grounded isolation structure 302. In some such embodiments, the backside grounded isolation structure 302 of the backside interconnect dielectric structure 126 are grounded to ground the base layer 110 of the SOI substrate 104. By grounding the base layer 110 of the SOI substrate 104, the electrical potential of the base layer 110 is grounded which increases the breakdown voltage of the first semiconductor device 118 and the second semiconductor device 116 by reducing the surface field of the base layer 110.

Figure 20:
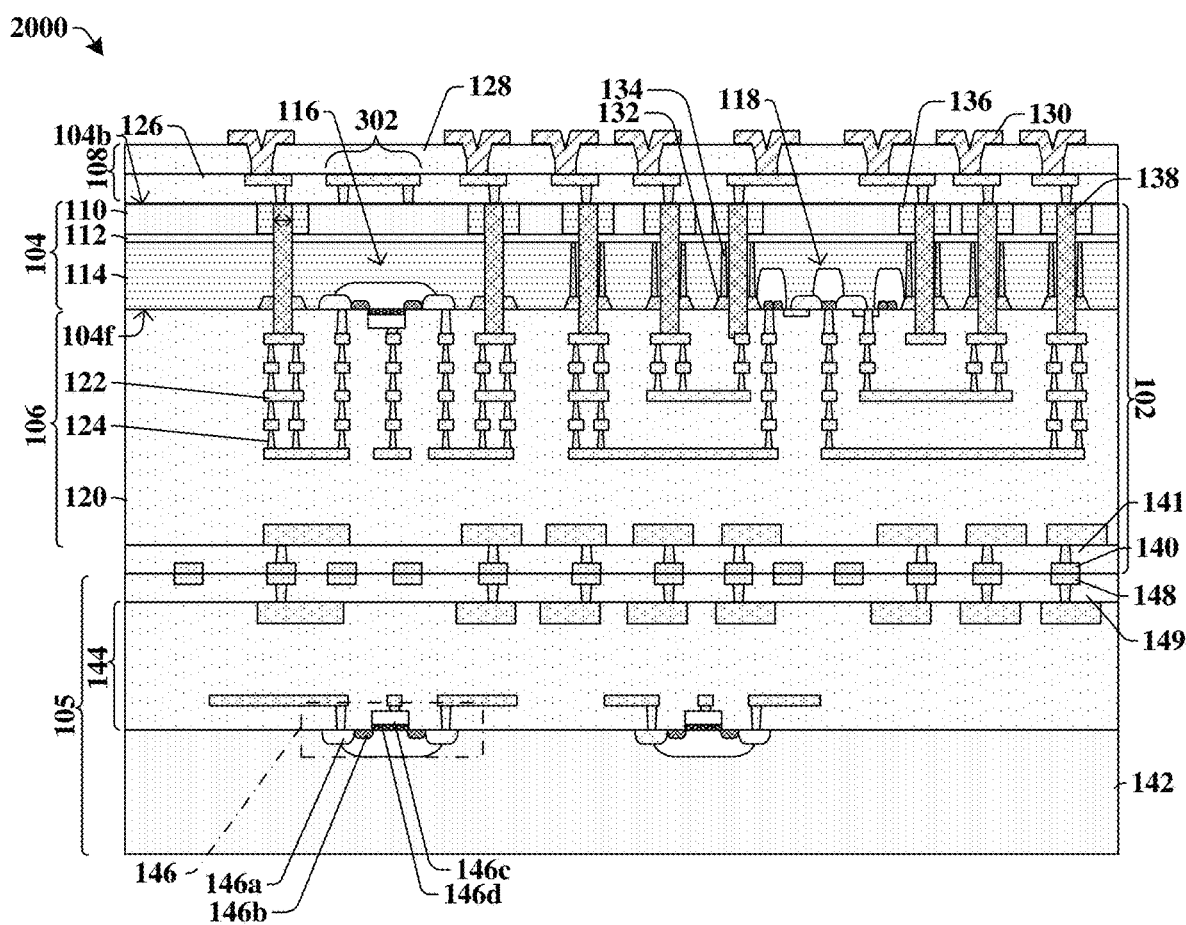

As shown in cross-sectional view 2000 of FIG. 20, a backside dielectric layer 128 is formed over the backside interconnect dielectric structure 126. In some embodiments, the backside dielectric layer 128 is formed using the same or similar materials and processes as the first interconnect structure 106. In some embodiments, bond pad structures 130 are then formed in the backside dielectric layer 128 to contact the interconnect wires 122 and the interconnect vias 124 of the backside interconnect dielectric structure 126. Therefore, the bond pad structures 130 are coupled to the BTSVs 138 and first and second semiconductor devices 118, 116. In some embodiments, the bond pad structures 130 are formed within the backside dielectric layer 128 through various steps of photolithography, removal, and deposition processes. In some embodiments, the bond pad structures 130 comprise, for example, copper, aluminum, titanium, tantalum, tungsten, or some other suitable conductive material. In some embodiments another chip and/or an external signal (e.g., current, voltage) source may be coupled to the bond pad structures 130 to access the first and/or second semiconductor devices 118, 116. In some embodiments, the features (e.g., 126, 128, 130, etc.) arranged on the backside 104b of the SOI substrate 104 make up a backside interconnect structure 108 that is coupled to the first interconnect structure 106 through the BTSVs 138.

Because the third semiconductor device 146 is formed independently of the first semiconductor device 118 and because the first semiconductor device 118 is accessed through the backside 104b of the SOI substrate 104, the first semiconductor device 118, which is a high-voltage device, can be integrated with other devices (e.g., 116, 146) without compromising the reliability of the overall device.

Figure 21:
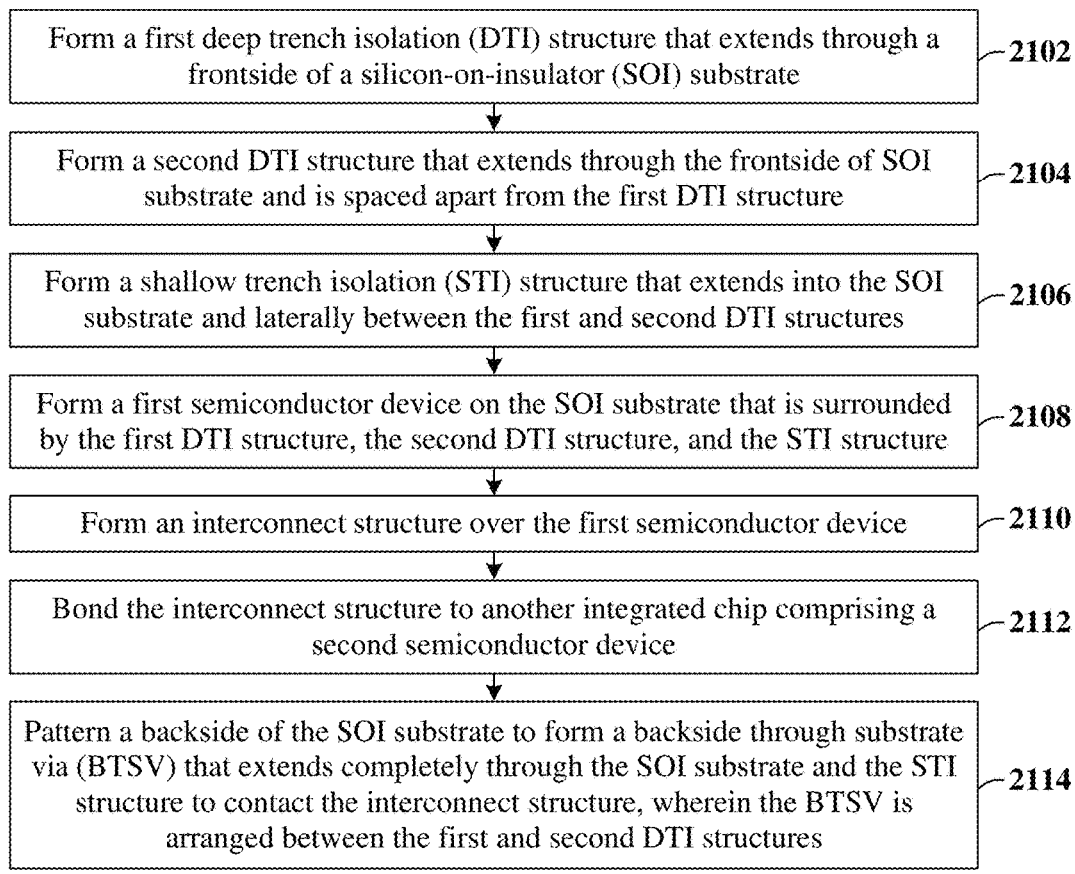
FIG. 21 illustrates a flow diagram of some embodiments of a method corresponding to the method of FIGS. 6-20.

FIG. 21 illustrates a flow diagram of some embodiments of a method 2100 corresponding to the method illustrated in FIGS. 6-20.

While method 2100 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 2102, a first deep trench isolation (DTI) structure is formed that extends through a frontside of a silicon-on-insulator (SOI) substrate.

At act 2104, a second DTI is formed that extends through the frontside of the SOI substrate and is spaced apart from the DTI structure. FIG. 7A illustrates a cross-sectional view 700A of some embodiments corresponding to acts 2102 and 2104.

At act 2106, a shallow trench isolation (STI) structure is formed that extends into the SOI substrate and laterally between the first and second DTI structures. FIG. 8 illustrates a cross-sectional view 800 of some embodiments corresponding to act 2106.

At act 2108, a first semiconductor device is formed on the SOI substrate, wherein the first semiconductor device is surrounded by the first DTI structure, the second DTI structure, and the STI structure. FIG. 9 illustrates a cross-sectional view 900 of some embodiments corresponding to act 2108.

At act 2110, an interconnect structure is formed over the first semiconductor device. FIG. 10 illustrates a cross-sectional view 1000 of some embodiments corresponding to act 2110.

At act 2112, the interconnect structure is bonded to another integrated chip comprising a second semiconductor device. FIG. 12 illustrates a cross-sectional view 1200 of some embodiments corresponding to act 2112.

At act 2114, a backside of the SOI substrate is patterned to form a backside through substrate via (BTSV) that extends completely through the SOI substrate and the STI structure to contact the interconnect structure, wherein the BTSV is arranged between the first and second DTI structures. FIGS. 13-18 illustrate cross-sectional views 1300-1800 of some embodiments corresponding to act 2114.

Therefore, the present disclosure relates to a device and method of manufacturing the device that comprises a high-voltage device and a low-voltage device coupled to the same circuitry. Through the use of deep trench isolation structures, backside through substrate vias, and bonding structures, the complex manufacturing process to form the high-voltage device does not damage the low-voltage device.

Accordingly, in some embodiments, the present disclosure relates to a device, comprising: a silicon-on-insulator (SOI) substrate comprising an insulator layer between an active layer and a base layer; a first semiconductor device disposed on a first side of the SOI substrate; an interconnect structure arranged over the first side of the SOI substrate and coupled to the first semiconductor device; a shallow trench isolation (STI) structure arranged within the first side of the SOI substrate and surrounding the first semiconductor device; a first deep trench isolation (DTI) structure extending from the STI structure to the insulator layer of the SOI substrate; a second DTI structure extending from the STI structure to the insulator layer of the SOI substrate, wherein portions of the first DTI structure are spaced apart from portions of the second DTI structure by the active layer of the SOI substrate; and a through substrate via (TSV) extending completely through the SOI substrate from a second side to the first side of the SOI substrate, wherein the TSV is arranged directly between the first DTI structure and the second DTI structure, and wherein the TSV is coupled to the interconnect structure.

In other embodiments, the present disclosure relates to a device comprising: a first integrated chip (IC) comprising: a silicon-on-insulator (SOI) substrate comprising an insulator layer between an active layer and a base layer; a first semiconductor device arranged on a first side of the SOI substrate; a first interconnect structure comprising interconnect wires and vias embedded within an interconnect dielectric structure, arranged over the first side of the SOI substrate, and coupled to the first semiconductor device; first hybrid bond structures arranged on the first interconnect structure; a bond pad structure arranged on a second side of the SOI substrate; a shallow trench isolation (STI) structure arranged within the first side of the active layer of the SOI substrate and surrounding the first semiconductor device; a through substrate via (TSV) extending through the STI structure and the SOI substrate from the second side of the SOI substrate to the first side of the SOI substrate and coupling the bond pad structure to the first interconnect structure; deep trench isolation (DTI) structures extending through the active layer of the SOI substrate and surrounding the TSV; and a second IC bonded to the first IC and comprising: a second substrate; a second semiconductor device arranged on a first side of the second substrate; a second interconnect structure arranged over and coupled to the second semiconductor device; and second hybrid bond structures arranged on the second interconnect structure and bonded to the first hybrid bond structures of the first IC.

In yet other embodiments, the present disclosure relates to a method comprising: forming a first deep trench isolation (DTI) structure that extends through an active layer of a silicon-on-insulator (SOI) substrate to contact an insulator layer of the SOI substrate, wherein the SOI substrate comprises the insulator layer arranged over a base layer and the active layer arranged over the insulator layer; forming a second DTI structure that extends through the active layer of the SOI substrate to contact the insulator layer of the SOI substrate, wherein the second DTI structure is spaced apart from the first DTI structure by the active layer; forming a shallow trench isolation (STI) structure that extends into the active layer of the SOI substrate extends laterally between and contacts the first and second DTI structures; forming a first semiconductor device on the SOI substrate, wherein the STI structure, the first DTI structure, and the second DTI structure continuously surround the first semiconductor device; forming an interconnect structure over the first semiconductor device and SOI substrate, wherein the interconnect structure comprises interconnect wires and interconnect vias embedded within an interconnect dielectric structure; forming first hybrid bond layers over the interconnect structure; bonding the first hybrid bond layers to hybrid bond layers of another integrated circuit on another substrate; flipping the SOI substrate to thin-down the base layer of the SOI substrate; patterning the SOI substrate to form an opening in the SOI substrate arranged between the first and second DTI structures; and forming a through substrate via (TSV) within the opening of the SOI substrate, wherein the TSV extends completely through the SOI substrate, the STI structure, and a portion of the interconnect dielectric structure to contact an interconnect wire or interconnect via of the interconnect structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a first deep trench isolation (DTI) structure that extends through an active layer of a silicon-on-insulator (SOI) substrate to contact an insulator layer of the SOI substrate, wherein the SOI substrate comprises the insulator layer arranged over a base layer and the active layer arranged over the insulator layer;
    forming a second DTI structure that extends through the active layer of the SOI substrate to contact the insulator layer of the SOI substrate, wherein the second DTI structure is spaced apart from the first DTI structure by the active layer;
    forming a shallow trench isolation (STI) structure that extends into the active layer of the SOI substrate and that extends laterally between and contacts the first and second DTI structures;
    forming a first semiconductor device on the SOI substrate, wherein the STI structure, the first DTI structure, and the second DTI structure continuously surround the first semiconductor device;
    forming an interconnect structure over the first semiconductor device and the SOI substrate, wherein the interconnect structure comprises interconnect wires and interconnect vias embedded within an interconnect dielectric structure;
    forming first hybrid bond layers over the interconnect structure;

bonding the first hybrid bond layers to hybrid bond layers of another integrated circuit on another substrate;

flipping the SOI substrate to thin-down the base layer of the SOI substrate;

patterning the SOI substrate to form an opening in the SOI substrate arranged between the first and second DTI structures; and forming a through substrate via (TSV) within the opening of the SOI substrate, wherein the TSV extends completely through the SOI substrate, the STI structure, and a portion of the interconnect dielectric structure to contact an interconnect wire or interconnect via of the interconnect structure.

2. The method of claim 1, further comprising:
forming a dielectric layer over the base layer of the SOI substrate; and
forming a bond pad structure within the dielectric layer, wherein the bond pad structure is coupled to the TSV and the first semiconductor device.

3. The method of claim 1, wherein forming the opening in the SOI substrate comprises:
removing portions of the base layer to form a first opening having a first width within the base layer, wherein the first opening is arranged directly over the first and second DTI structures, wherein outer sidewalls of the first opening are defined by inner sidewalls of the base layer, and wherein a bottom surface of the first opening is defined by the insulator layer;
forming an isolation spacer structure along the inner sidewalls of the base layer, wherein a small opening remains in the base layer defined by inner sidewalls of the isolation spacer structure and the insulator layer; and
performing a removal process to remove portions of the insulator layer, the active layer, the STI structure, and the interconnect dielectric structure arranged below the small opening to expose one of the interconnect wires or vias.

4. The method of claim 1, wherein the first semiconductor device is configured to operate at 100 volts or higher.

5. The method of claim 3, wherein the first opening has a width greater than a separation between the first and second DTI structures, and wherein the small opening has a width that is less the separation between the first and second DTI structures.

6. The method of claim 1, further comprising:
forming a second semiconductor device on the SOI substrate, laterally spaced apart from the first semiconductor device,
forming an additional STI structure that extends into the active layer of the SOI substrate and that surrounds the second semiconductor device; and
forming an additional TSV extending completely through the SOI substrate and laterally and directly contacting the SOI substrate, wherein the additional TSV is not surrounded by DTI structures.

7. A method, comprising:
providing a substrate comprising a base semiconductor layer at a backside of the substrate, a dielectric layer overlying the base semiconductor layer, and a device semiconductor layer overlying the dielectric layer at a frontside of the substrate;
forming a pair of deep trench isolation (DTI) structures extending through the device semiconductor layer to the dielectric layer;
forming a first semiconductor device on the frontside of the substrate, wherein the first semiconductor device is surrounded by the pair of DTI structures, which extend in a closed path around the first semiconductor device;
bonding an integrated circuit (IC) to the frontside of the substrate, wherein the IC comprises a second semiconductor device; and
forming a through via directly between and spaced from the pair of DTI structures, and extending to the frontside of the substrate from the backside of the substrate, after the bonding;
wherein the second semiconductor device has an operating voltage less than an operating voltage of the first semiconductor device.

8. The method according to claim 7, further comprising:
performing an etch into the device semiconductor layer, wherein the etch stops on the dielectric layer to form a pair of DTI openings spaced from the base semiconductor layer by the dielectric layer, and wherein the pair of DTI structures are formed respectively filling the pair of DTI openings.

9. The method according to claim 7, further comprising:
forming an interconnect structure on the frontside of the substrate and comprising a plurality of wires and a plurality of vias that are alternatingly stacked away from the substrate, wherein the through via extends to a wire of the interconnect structure on the frontside of the substrate.

10. The method according to claim 7, further comprising:
performing a first etch into the base semiconductor layer to form an opening overlying the pair of DTI structures, wherein the first etch stops on the dielectric layer;
forming a sidewall spacer on sidewalls of the base semiconductor layer in the opening;
performing a second etch into the dielectric layer and the device semiconductor layer with the sidewall spacer in place to extend the opening; and
depositing conductive material filling the opening to form the through via.

11. The method according to claim 7, further comprising:
forming a third semiconductor device on the frontside of the substrate, laterally separated from the first semiconductor device by the pair of DTI structures, wherein the third semiconductor device has an operating voltage spaced from and between the operating voltage of the first semiconductor device and the operating voltage of the second semiconductor device.

12. The method according to claim 7, wherein the method further comprises:
forming a third semiconductor device on the frontside of the substrate, laterally separated from the first semiconductor device; and
forming a shallow trench isolation (STI) structure extending into the device semiconductor layer, adjacent to the third semiconductor device, wherein the STI structure is completely spaced from DTI structures.

13. The method according to claim 12, further comprising:
forming an additional STI structure extending into the device semiconductor layer, wherein the additional STI structure has a surface that faces and directly contacts the pair of DTI structures.

14. A method, comprising:
providing a substrate comprising a base semiconductor layer, a dielectric layer overlying the base semiconductor layer, and a device semiconductor layer overlying the dielectric layer;

forming a trench isolation structure extending into the substrate to the dielectric layer and surrounding a portion of the device semiconductor layer;

forming a first semiconductor device on the portion of the device semiconductor layer;

forming a second semiconductor device on the substrate, laterally separated from the first semiconductor device by the trench isolation structure, wherein semiconductor material of the device semiconductor layer extends continuously from the second semiconductor device to the trench isolation structure;

bonding an integrated circuit (IC) to the substrate, such that the first and second semiconductor devices are between the IC and the substrate; and forming a through via extending through an entire thickness of the substrate, and directly between segments of the trench isolation structure, after the bonding.

15. The method according to claim 14, further comprising:

forming an additional trench isolation structure surrounding the second semiconductor device; and forming an additional through via extending through the entire thickness of the substrate, and directly between segments of the additional trench isolation structure, after the bonding, wherein the additional trench isolation structure has a height less than a height of the trench isolation structure.

16. The method according to claim 15, wherein semiconductor material of the device semiconductor layer is continuous from the additional through via to the trench isolation structure.

17. The method according to claim 14, wherein the forming of the trench isolation structure comprises:

forming a pair of ring-shaped deep trench isolation (DTI) structures extending into the substrate and surrounding the portion of the device semiconductor layer, wherein the segments of the trench isolation structure correspond to the DTI structures; and forming a shallow trench isolation (STI) structure overlapping with and directly contacting the pair of ring-shaped DTI structures.

18. The method according to claim 14, further comprising:

forming an interconnect structure overlying and electrically coupled to the first and second semiconductor devices; and forming a bond structure overlying and electrically coupled to the interconnect structure, wherein the substrate, the interconnect structure, and the bond structure form another IC, which is bonded to the IC by the bonding.

19. The method according to claim 18, wherein the bonding comprises metal-to-metal bonding and dielectric-to-dielectric bonding.

20. The method according to claim 14, further comprising:

forming a conductive pad overlying and electrically coupled to the through via, wherein the conductive pad is separated from the first semiconductor device by the substrate and is electrically coupled to the first semiconductor device via the through via.

* * * * *